United States Patent
Chen et al.

(10) Patent No.: US 11,935,802 B2
(45) Date of Patent: *Mar. 19, 2024

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/808,632

(22) Filed: Jun. 24, 2022

(65) Prior Publication Data

US 2022/0319941 A1    Oct. 6, 2022

Related U.S. Application Data

(60) Continuation of application No. 17/008,966, filed on Sep. 1, 2020, now Pat. No. 11,380,598, which is a
(Continued)

(51) Int. Cl.
  *H01L 23/28*   (2006.01)
  *H01L 23/367*  (2006.01)
  (Continued)

(52) U.S. Cl.
  CPC ............ *H01L 23/28* (2013.01); *H01L 23/367* (2013.01); *H01L 25/0657* (2013.01); *H01L 25/50* (2013.01)

(58) Field of Classification Search
  CPC ... H01L 23/28; H01L 23/367; H01L 25/0657; H01L 25/50; H01L 24/03; H01L 24/05;
  (Continued)

(56) References Cited

U.S. PATENT DOCUMENTS 6,930,378 B1   8/2005   St. Amand et al.
8,778,738 B1   7/2014   Lin et al.
(Continued)

FOREIGN PATENT DOCUMENTS

CN    106463469 A    2/2017
TW    201029147 A    8/2010
WO    2018075204 A1  4/2018

*Primary Examiner* — Tong-Ho Kim
(74) *Attorney, Agent, or Firm* — Slater Matsil, LLP

(57) ABSTRACT

A package and a method of forming the same are provided. The package includes: a die stack bonded to a carrier, the die stack including a first integrated circuit die, the first integrated circuit die being a farthest integrated circuit die of the die stack from the carrier, a front side of the first integrated circuit die facing the carrier; a die structure bonded to the die stack, the die structure including a second integrated circuit die, a backside of the first integrated circuit die being in physical contact with a backside of the second integrated circuit die, the backside of the first integrated circuit die being opposite the front side of the first integrated circuit die; a heat dissipation structure bonded to the die structure adjacent the die stack; and an encapsulant extending along sidewalls of the die stack and sidewalls of the heat dissipation structure.

20 Claims, 30 Drawing Sheets

Related U.S. Application Data continuation of application No. 16/568,615, filed on Sep. 12, 2019, now Pat. No. 11,018,066, which is a division of application No. 15/983,156, filed on May 18, 2018, now Pat. No. 10,510,629.

(51) Int. Cl.
*H01L 25/00* (2006.01)
*H01L 25/065* (2023.01)

(58) Field of Classification Search
CPC ......... H01L 24/06; H01L 24/11; H01L 24/13; H01L 24/73; H01L 25/03; H01L 2224/03002; H01L 2224/0401; H01L 2224/04105; H01L 2224/0557; H01L 2224/05572; H01L 2224/06181; H01L 2224/08145; H01L 2224/08146; H01L 2224/11002; H01L 2224/11849; H01L 2224/131; H01L 2224/73259; H01L 2224/80006; H01L 2224/94; H01L 2225/06541; H01L 2225/06586; H01L 2225/06589; H01L 21/56; H01L 21/561; H01L 23/16; H01L 23/3107; H01L 23/3121; H01L 23/3135; H01L 23/562; H01L 24/19; H01L 24/80; H01L 23/3738; H01L 2224/97; H01L 2924/19105; H01L 23/4334; H01L 23/3128; H01L 23/49816; H01L 23/49822; H01L 23/49827; H01L 25/0756

USPC ........................................................ 257/774
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,380,598 B2 * | 7/2022 | Chen ....................... H01L 21/56 |
| 2006/0284299 A1 | 12/2006 | Karnezos |
| 2013/0270721 A1 | 10/2013 | Chiriac et al. |
| 2015/0279431 A1 | 10/2015 | Li et al. |
| 2015/0303174 A1 | 10/2015 | Yu et al. |
| 2016/0190103 A1 | 6/2016 | Kabe et al. |
| 2018/0012865 A1 | 1/2018 | Schrock |
| 2018/0108592 A1 | 4/2018 | Hembree et al. |
| 2018/0158749 A1 | 6/2018 | Yu et al. |
| 2018/0174865 A1 | 6/2018 | Yu et al. |
| 2019/0122950 A1 * | 4/2019 | Groothuis ........... H01L 23/3675 |

\* cited by examiner

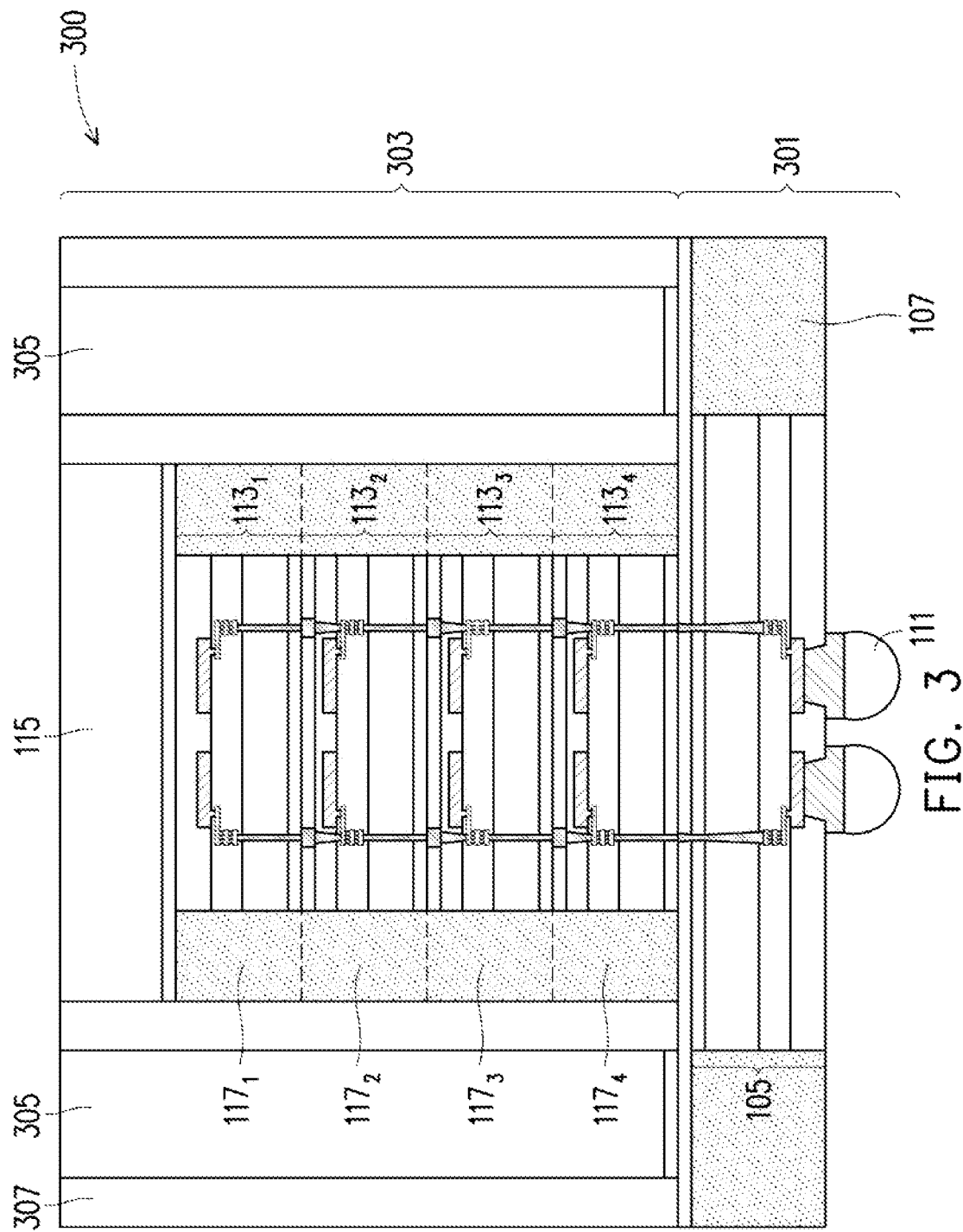

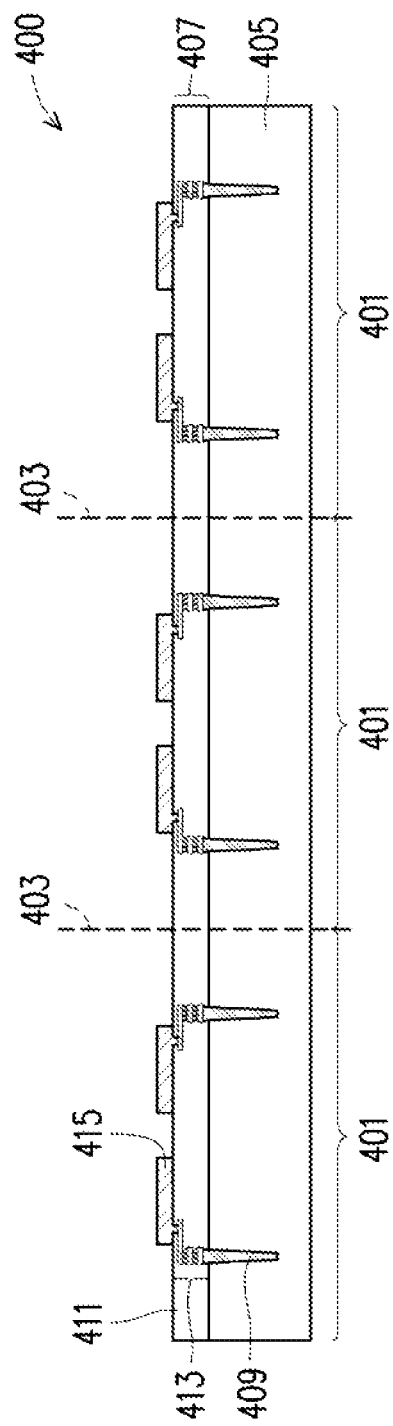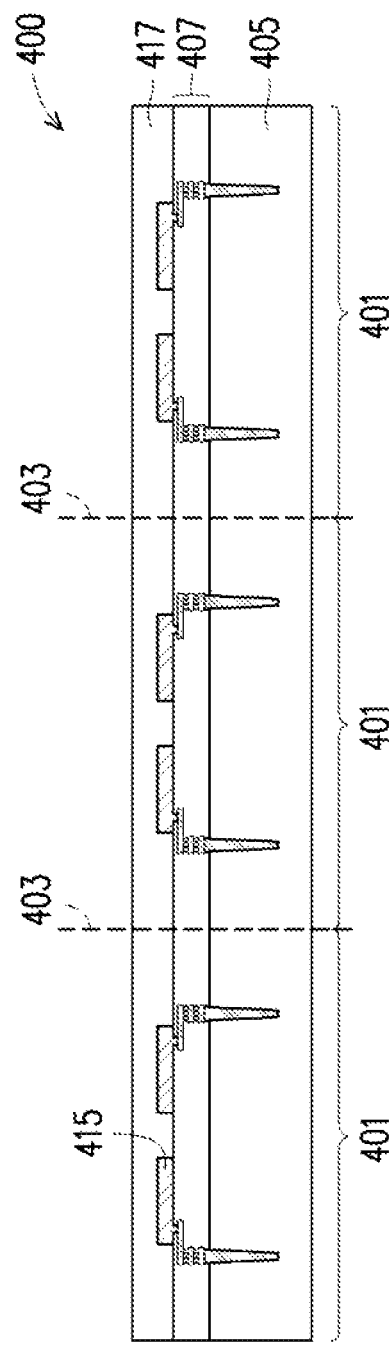

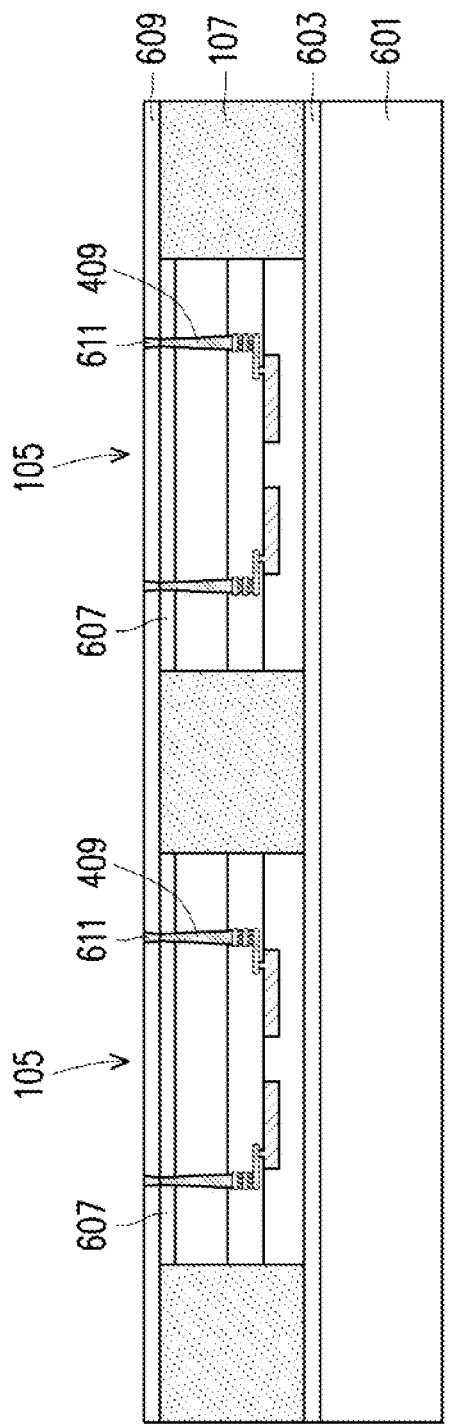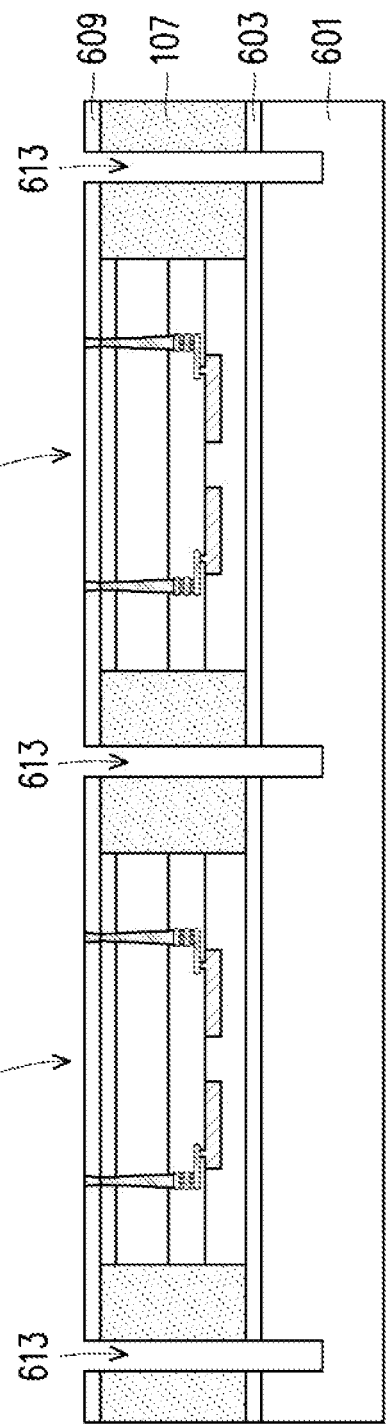
FIG. 6F
FIG. 6G

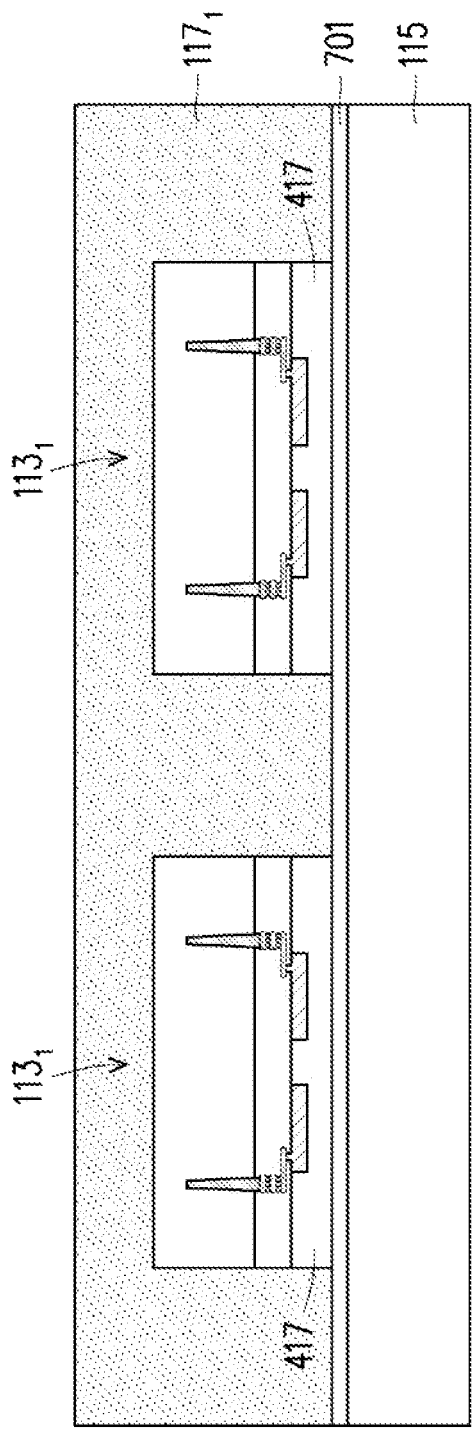
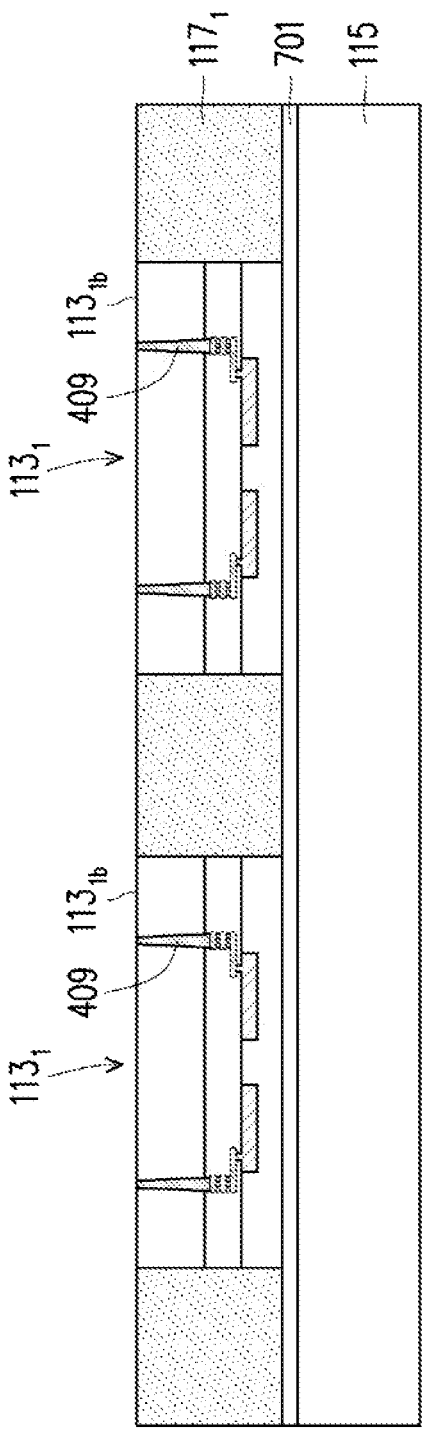
FIG. 7B
FIG. 7C

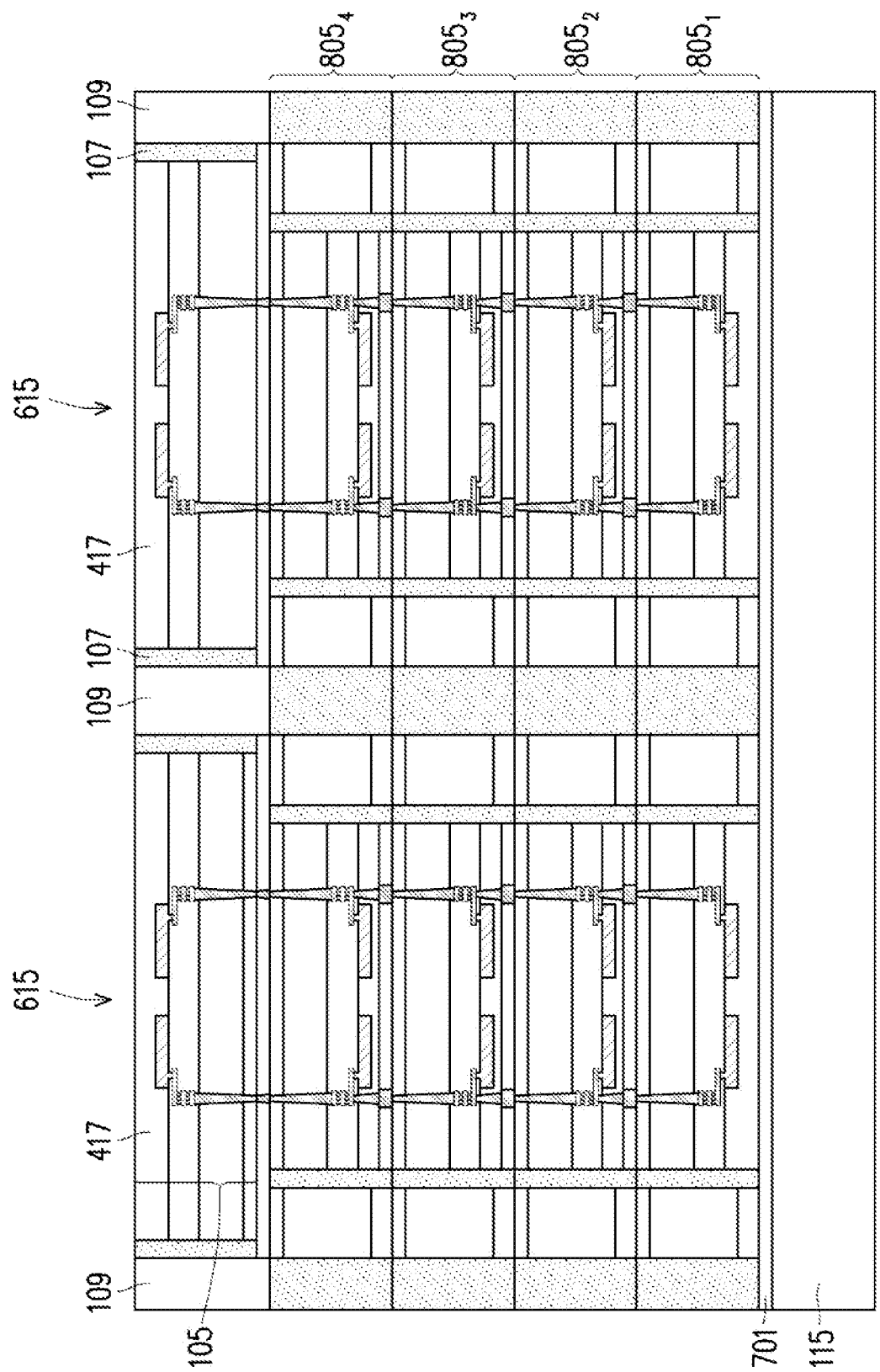

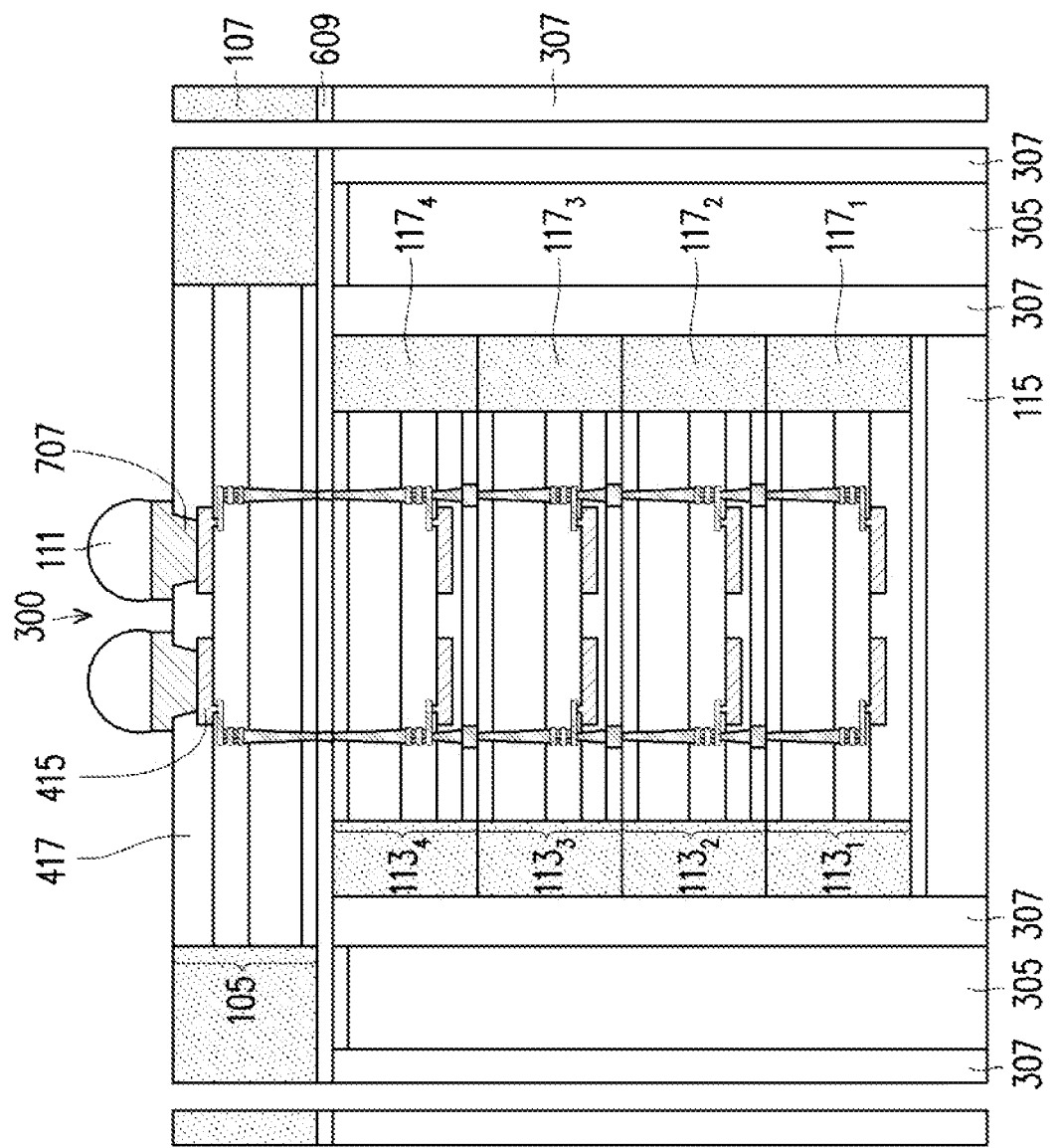

INTEGRATED CIRCUIT PACKAGE AND METHOD OF FORMING SAME

PRIORITY CLAIM AND CROSS-REFERENCE

This application is a continuation of U.S. patent application Ser. No. 17/008,966, filed on Sep. 1, 2020, now U.S. Pat. No. 11,380,598, issued on Jul. 5, 2022, entitled "Integrated Circuit Package and Method of Forming Same," which is a continuation of U.S. patent application Ser. No. 16/568,615, filed on Sep. 12, 2019, now U.S. Pat. No. 11,018,066, issued on May 25, 2021, entitled "Integrated Circuit Package and Method of Forming Same," which is a divisional and claims the benefit of U.S. patent application Ser. No. 15/983,156, filed on May 18, 2018, now U.S. Pat. No. 10,510,629, issued on Dec. 17, 2019, entitled "Integrated Circuit Package and Method of Forming Same," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of an integrated circuit package in accordance with some embodiments.

FIGS. 4A-4C illustrate cross-sectional views of various processing steps during fabrication of integrated circuit dies in accordance with some embodiments.

FIGS. 6A-6H illustrate cross-sectional views of various processing steps during fabrication of integrated circuit die structures in accordance with some embodiments.

FIGS. 7A-7I illustrate cross-sectional views of various processing steps during fabrication of integrated circuit packages in accordance with some embodiments.

FIGS. 8A-8E illustrate cross-sectional views of various processing steps during fabrication of integrated circuit packages in accordance with some embodiments.

FIGS. 9A-9D illustrate cross-sectional views of various processing steps during fabrication of integrated circuit packages in accordance with some embodiments.

DETAILED DESCRIPTION

Figure 1A:
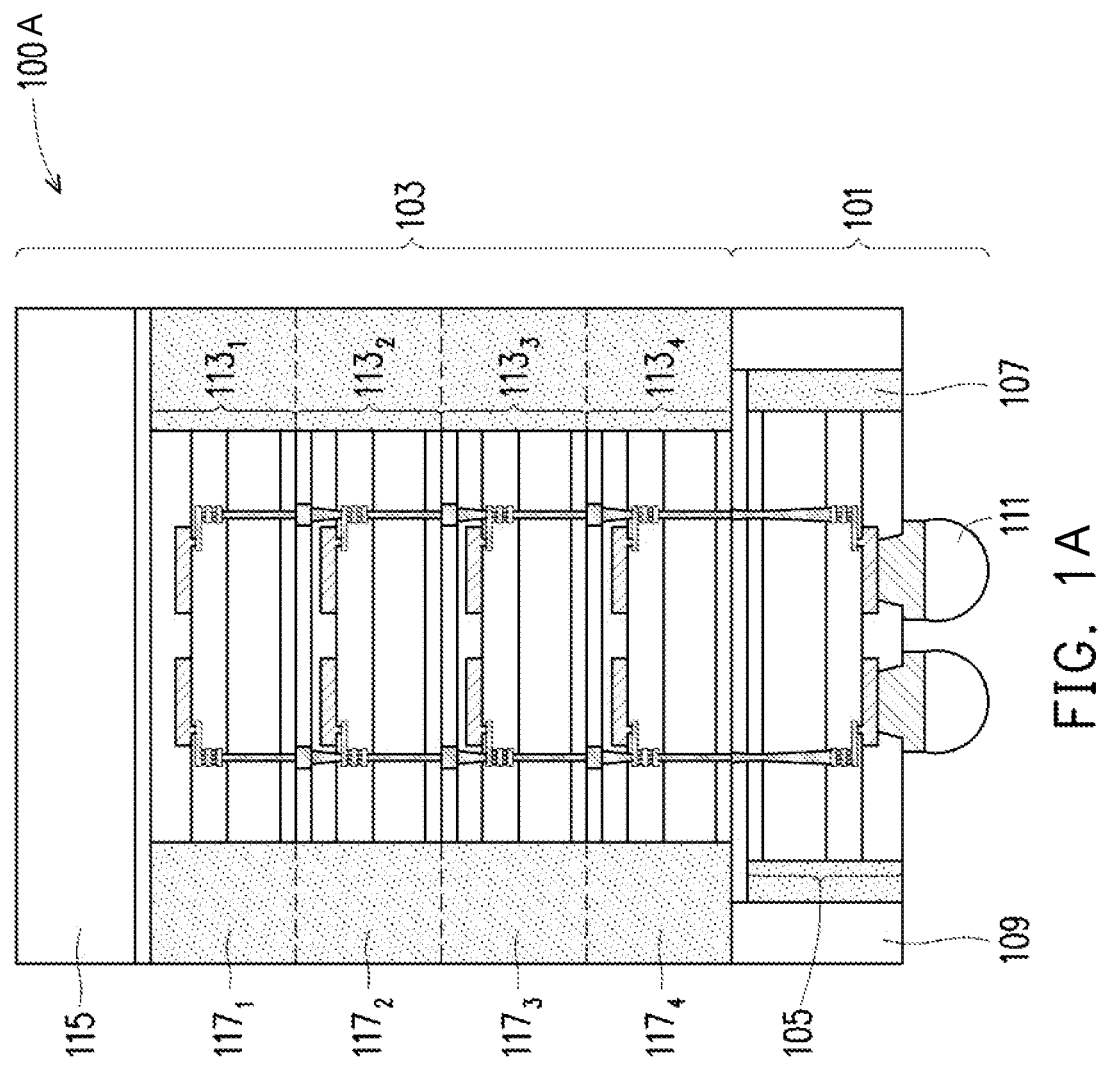
FIG. 1A illustrates a cross-sectional view of an integrated circuit package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package and a method of forming the same. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuit or electrical component. Various embodiments described herein allow for forming integrated circuit packages by direct bonding integrated circuit dies to one another. Various embodiments described herein further allow for avoiding a thermal damage of integrated circuit packages by back-to-back bonding integrated circuit dies and by embedding heat dissipation structures within integrated circuit packages.

FIG. 1A illustrates a cross-sectional view of an integrated circuit (IC) package 100A in accordance with some embodiments. In some embodiments, the IC package 100A comprises a first IC die structure 101 bonded to a second IC die structure 103. In some embodiments, the first IC die structure 101 is electrically connected to the second IC die structure 103. The first IC die structure 101 comprises an IC die 105 encapsulated in encapsulants 107 and 109. In some embodiments, the IC die 105 may comprise a logic die, a memory die, a CPU, a GPU, an xPU, a MEMS die, an SoC die, or the like. The encapsulants 107 and 109 may comprise suitable insulating materials. In some embodiments, the encapsulants 107 and 109 may comprise a same material. In other embodiments, the encapsulants 107 and 109 may comprise different materials. In some embodiments, the first IC die structure 101 further comprises a plurality of connectors 111, which provide an electrical connection to the IC package 100A and external components bonded to the connectors 111.

The second IC die structure 103 comprises a stack of IC dies $113_1$-$113_4$ bonded to a base structure (a support structure or a carrier) 115. In some embodiments, the IC dies $113_1$-$113_4$ are bonded to one another in a pairwise manner, such that a backside of one IC die in a pair is bonded to a front side of another die in the pair. Furthermore, a front side of the IC die $113_1$ is bonded to the base structure 115. In some embodiments, the IC dies $113_1$-$113_4$ may comprise a logic die, a memory die, a CPU, a GPU, an xPU, a MEMS die, an SoC die, or the like. The base structure 115 may comprise a semiconductor material, an insulating material, or the like. In some embodiments, the base structure 115 may comprise a same material as the substrate of the IC dies 105 and $113_1$-$113_4$. In such embodiments, the base structure 115 and the IC dies 105 and $113_1$-$113_4$ may have substantially similar coefficients of thermal expansion (CTEs), which may prevent the damage of the IC package 100A due to the CTE mismatch. In some embodiments, the base structure 115 may not comprise active and/or passive devices on or in the base structure 115. In some embodiments, the IC dies $113_1$-$113_4$ are encapsulated in encapsulants $117_1$-$117_4$, respectively. In some embodiments, the encapsulants $117_1$-$117_4$ may comprise a suitable insulating material. In some embodiments, the encapsulants $117_1$-$117_4$ may comprise a same material. In other embodiments, the encapsulants $117_1$-$117_4$ may comprise different materials. In the embodiment illustrated in FIG. 1A, the IC die structure 101 comprises a single IC die (such as the IC die 105), and the IC die structure 103 comprises four IC dies (such as the IC dies $113_1$-$113_4$). In other embodiments, the IC die structure 101 may comprise more than one IC die and the IC die structure 103 may comprise more or less than four IC dies, depending on design requirements for the IC package 100A. In some embodiments, the IC package 100A may be formed using a method described below with reference to FIGS. 7A-7I, and the detailed description of the IC package 100A is provided at that time.

Figure 1B:
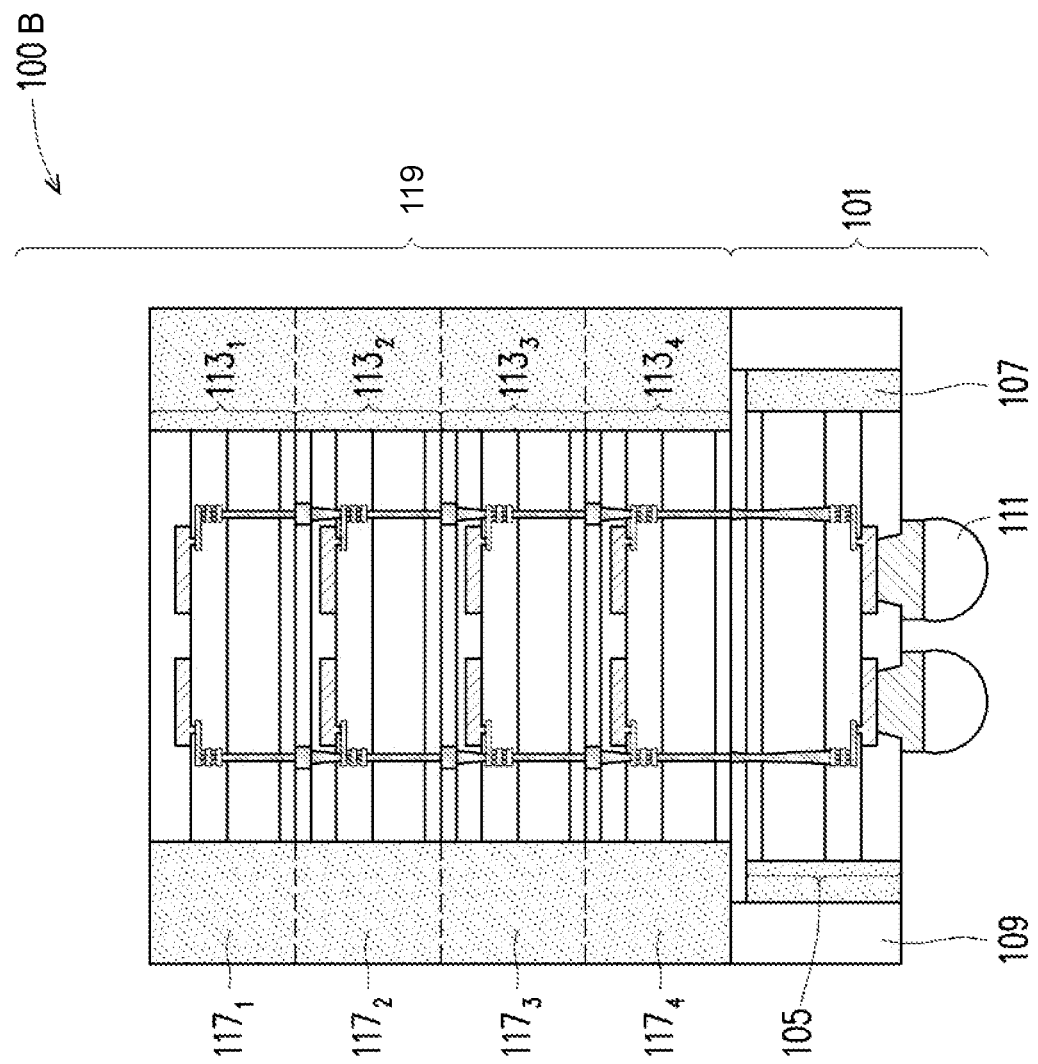
FIG. 1B illustrates a cross-sectional view of an integrated circuit package in accordance with some embodiments.

FIG. 1B illustrates a cross-sectional view of an integrated circuit (IC) package 100B in accordance with some embodiments. To highlight differences between the IC package 100A illustrated in FIG. 1A and the IC package 100B illustrated in FIG. 1B, the common features of these packages are labeled by same numerical references and their description is not repeated herein. In some embodiments, the IC package 100B comprises a first IC die structure 101 bonded to a second IC die structure 119. In some embodiments, the second IC die structure 119 is similar to the second die structure 103 illustrated in FIG. 1A, with the distinction that the base structure 115 has been omitted from the second IC die structure 119. In some embodiments, the IC package 100B may be formed using a method described below with reference to FIGS. 7A-7I, and the detailed description of the IC package 100B is provided at that time.

Figure 2:
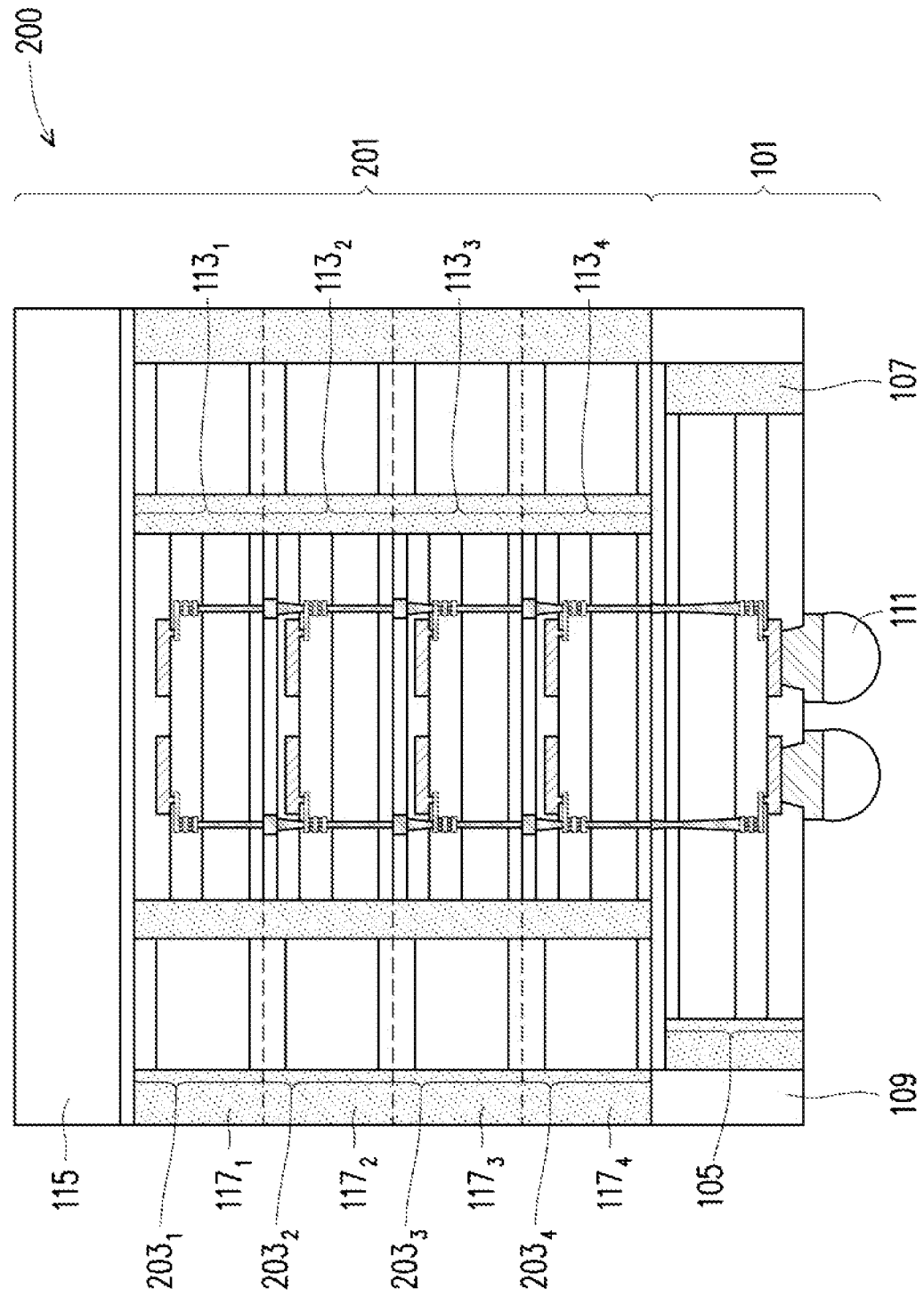
FIG. 2 illustrates a cross-sectional view of an integrated circuit package in accordance with some embodiments.

FIG. 2 illustrates a cross-sectional view of an IC package 200 in accordance with some embodiments. To highlight differences between the IC package 200 illustrated in FIG. 2 and the IC package 100A illustrated in FIG. 1A, the common features of these packages are labeled by same numerical references and their description is not repeated herein. In some embodiments, the IC package 200 comprises a first IC die structure 101 bonded to a second IC die structure 201. The second IC die structure 201 comprises a stack of IC dies $113_1$-$113_4$ bonded to a base structure 115. In some embodiments, the IC dies $113_1$-$113_4$ are encapsulated in encapsulants $117_1$-$117_4$, respectively. In some embodiments, dummy dies $203_1$-$203_4$ may be embedded in the encapsulants $117_1$-$117_4$, respectively. The dummy dies $203_1$-$203_4$ may comprise a semiconductor material, an insulating material, a combination thereof, or the like. In some embodiments, the dummy dies $203_1$-$203_4$ may comprise a same material as the substrates of the IC dies 105 and $113_1$-$113_4$. In such embodiments, the dummy dies $203_1$-$203_4$ and the IC dies 105 and $113_1$-$113_4$ may have substantially similar coefficients of thermal expansion (CTEs), which may prevent the damage of the IC package 200 due to the CTE mismatch. In some embodiments, dummy dies $203_1$-$203_4$ may not comprise active and/or passive devices and may not provide addition electrical functionality to the IC package 200. In some embodiments, the dummy dies $203_1$-$203_4$ may be configured as a heat dissipation feature that transfers heat away from the IC die 105 of the IC die structure 101. In the embodiment illustrated in FIG. 2, the IC die structure 201 comprises four IC dies (such as the IC dies $113_1$-$113_4$) and two stacks of four dummy dies (such as the dummy dies $203_1$-$203_4$). In other embodiments, the IC die structure 201 may comprise more or less than four IC dies and desired number of stacks comprising more or less than four dummy dies, depending on design requirements for the IC package 200. In some embodiments, the IC package 200 may be formed using a method described below with reference to FIGS. 8A-8E, and the detailed description of the IC package 200 is provided at that time.

FIG. 3 illustrates a cross-sectional view of an IC package 300 in accordance with some embodiments. To highlight differences between the IC package 300 illustrated in FIG. 3 and the IC package 100A illustrated in FIG. 1A, the common features of these packages are labeled by same numerical references and their description is not repeated herein. In some embodiments, the IC package 300 comprises a first IC die structure 301 bonded to a second IC die structure 303. In some embodiments, the first IC die structure 301 is electrically connected to the second IC die structure 303. The first IC die structure 301 comprises an IC die 105 encapsulated in an encapsulant 107. In some embodiments, the first IC die structure 301 further comprises a plurality of connectors 111, which provide an electrical connection to the IC package 300 and external components bonded to the connectors 111.

The second IC die structure 303 comprises a stack of IC dies $113_1$-$113_4$ bonded to a base structure 115. In some embodiments, the IC dies $113_1$-$113_4$ are encapsulated in encapsulants $117_1$-$117_4$, respectively. In some embodiments, second IC die structure 303 further comprises an encapsulant 307 encapsulating the base structure 115, the stack of IC dies $113_1$-$113_4$, and the encapsulants $117_1$-$117_4$. In some embodiments, the encapsulant 307 may comprise a suitable insulating material. In some embodiments, the encapsulant 307 and encapsulants $117_1$-$117_4$ may comprise a same material. In other embodiments, the encapsulant 307 and encapsulants $117_1$-$117_4$ may comprise different materials.

In some embodiments, dummy dies 305 may be embedded in the encapsulant 307. The dummy dies 305 may comprise a semiconductor material, an insulating material, a combination thereof, or the like. In some embodiments, dummy dies 305 may comprise a same material as the substrates of the IC dies 105 and $113_1$-$113_4$. In such embodiments, the dummy dies 305 and the IC dies 105 and $113_1$-$113_4$ may have substantially similar coefficients of thermal expansion (CTEs), which may prevent the damage of the IC package 300 due to the CTE mismatch. In some embodiments, the dummy dies 305 may not comprise active and/or passive devices and may not provide additional electrical functionality to the IC package 300. In some embodiments, the dummy dies 305 may be configured as a heat dissipation feature that transfers heat away from the IC die 105 of the IC die structure 301. In the embodiment illustrated in FIG. 3, the IC die structure 301 comprises a single die (such as the IC die 105), and the IC die structure 303 comprises four IC dies (such as the IC dies $113_1$-$113_4$) and two dummy dies (such as the dummy dies 305). In other embodiments, the IC die structure 301 may comprise more than one IC die and the IC die structure 303 may comprise more or less than four IC dies and more or less than two dummy dies, depending on design requirements for the IC package 300. In some embodiments, the IC package 300 may be formed using a method described below with reference to FIGS. 9A-9D, and the detailed description of the IC package 300 is provided at that time.

Figure 4C:
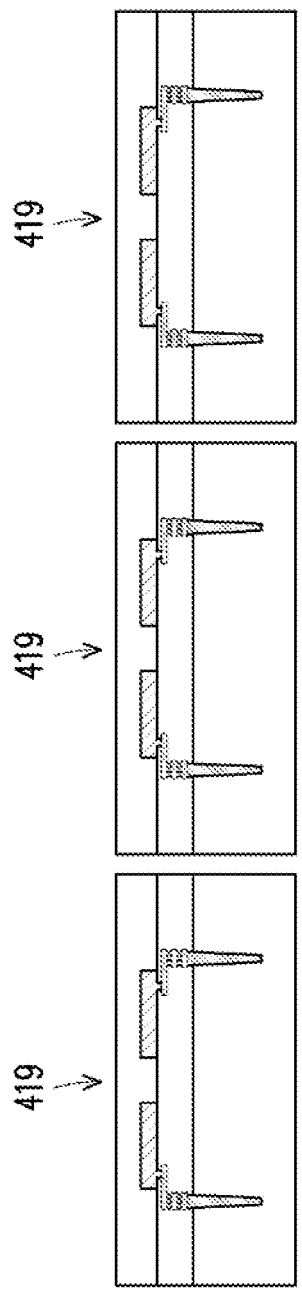

FIGS. 4A-4C illustrate cross-sectional views of various processing steps during fabrication of integrated circuit dies (such as, for example, the IC dies 105 and $113_1$ illustrated in FIGS. 1A, 1B, 2, and 3) in accordance with some embodiments. Referring to FIG. 4A, a portion of a wafer 400 having die regions 401 separated by scribe lines 403 (also referred to as dicing lines or dicing streets) is illustrated. As described below in greater detail, the wafer 400 will be diced along the scribe lines 403 to form individual integrated circuit dies (such as the IC dies 419 illustrated in FIG. 4C). In some embodiments, the wafer 400 comprises a substrate 405, one or more active and/or passive devices (not shown) on the substrate 405, and an interconnect structure 407 over the substrate 405 and the one or more active and/or passive devices. In some embodiments, the substrate 405 may be formed of silicon, although it may also be formed of other group III, group IV, and/or group V elements, such as silicon, germanium, gallium, arsenic, and combinations thereof. The substrate 405 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the substrate 405 may comprise through vias (TVs) 409 that extend from a front surface of the substrate 405 toward a backside surface of the substrate 405. In some embodiments, the TVs 409 may be formed by forming openings in the substrate 405 and filling the openings with suitable conductive materials. In some embodiments, the openings may be formed using suitable photolithography and etching methods. The openings may be filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive layer may be formed in the openings before filling the openings with suitable conductive materials.

In some embodiments, the one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structure 407 may comprise a plurality of dielectric layers 411 (such an inter-layer dielectric (ILD)/inter-metal dielectric layers (IMDs)) and interconnects 413 (such as conductive lines and vias) within the dielectric layers 411. the dielectric layers 411 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, interconnects 413 may be formed in the dielectric layers 411 using, for example, a damascene process, a dual damascene process, a combination thereof, or the like. In some embodiments, interconnects 413 may comprise copper, a copper alloy, silver, gold, tungsten, tantalum, aluminum, a combination thereof, or the like. In some embodiments, the interconnects 413 may provide electrical connections between the one or more active and/or passive devices formed on the substrate 405.

Referring further to FIG. 4A, contact pads 415 are formed over the interconnect structure 407. The contact pads 415 may be electrically coupled to the one or more active and/or passive devices through the interconnects 413. In some embodiments, the contact pads 415 may comprise a conductive material such as aluminum, copper, tungsten, silver, gold, a combination thereof, or the like. In some embodiments, a conductive material may be formed over the interconnect structure 407 using, for example, PVD, ALD, electro-chemical plating, electroless plating, a combination thereof, or the like. Subsequently, the conductive material is patterned to form the contact pads 415. In some embodiments, the conductive material may be patterned using suitable photolithography and etching methods.

Referring to FIG. 4B, an insulating layer 417 is formed over the interconnect structure 407 and the contact pads 415. In some embodiments, the insulating layer 417 may comprise one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the insulating layer 417 may comprise one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In some embodiments, the insulating layer 417 is planarized using a CMP process, a grinding process, an etching process, a combination thereof, or the like.

Referring to FIG. 4C, the wafer 400 (see FIG. 4B) is singulated to form individual dies 419. In some embodiments, the wafer 400 may be singulated into individual dies 419, for example, by sawing, laser ablation, etching, a combination thereof, or the like.

Figure 5A:
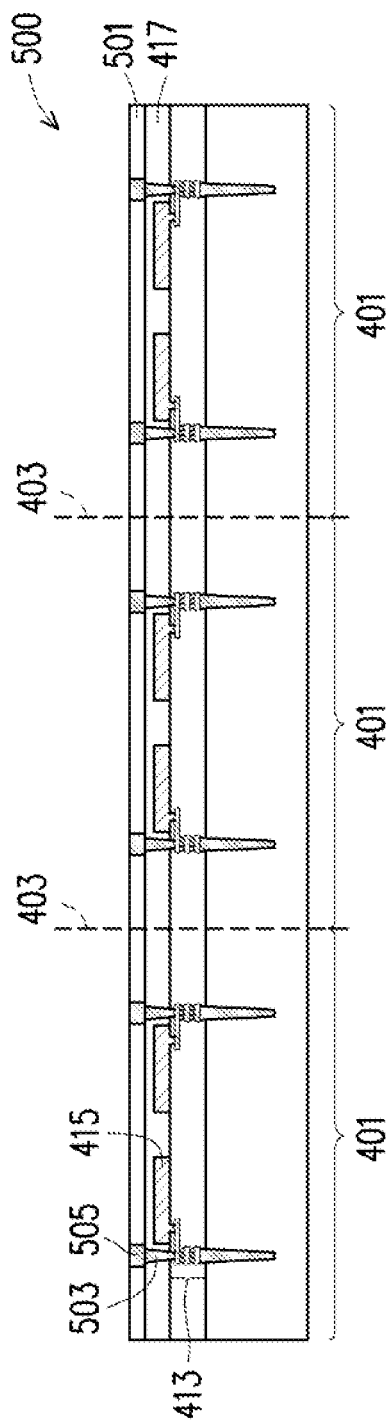
FIGS. 5A and 5B illustrate cross-sectional views of various processing steps during fabrication of integrated circuit dies in accordance with some embodiments.
Figure 5B:
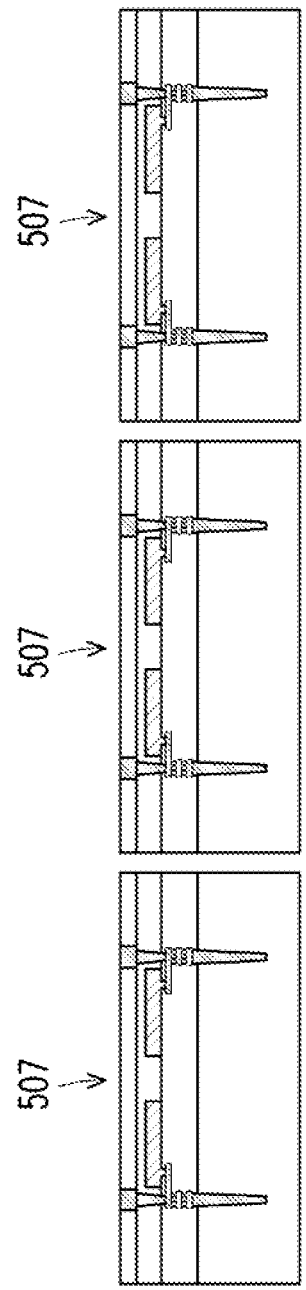

FIGS. 5A and 5B illustrate cross-sectional views of various processing steps during fabrication of integrated circuit dies (such as, for example, the IC dies 113$_2$-113$_4$ illustrated in FIGS. 1A, 1B, 2, and 3) in accordance with some embodiments. FIG. 5A illustrates a wafer 500 after preforming various processing steps on the wafer 400 illustrated in FIG. 4B in accordance with some embodiments. In some embodiments, an insulating layer 501 is formed over the insulating layer 417. In some embodiments, the insulating layer 501 may be formed using similar materials and methods as the insulating layer 417 described above with reference to FIG. 4B, and the description is not repeated herein. In some embodiments, the insulating layer 501 is planarized using a CMP process, a grinding process, an etching process, a combination thereof, or the like. In some embodiments, the insulating layer 501 and the insulating layer 417 may comprise a same material. In other embodiments, the insulating layer 501 and the insulating layer 417 may comprise different materials.

Referring further to FIG. 5A, bond pads 505 and corresponding vias 503 are formed in the insulating layers 417 and 501. In some embodiments, the bond pads 505 are formed in the insulating layer 501 and the vias 503 are formed in the insulating layer 417. In some embodiments, the bond pads 505 and the vias 503 may be formed using similar materials and methods as the interconnects 413 described above with reference to FIG. 4A, and the description is not repeated herein. In some embodiments, the bond pads 505 and the insulating layer 501 are planarized, such that topmost surfaces of the bond pads 505 are substantially level or coplanar with a topmost surface of the insulating layer 501. In some embodiments, the vias 503 are in direct electrical contact with the interconnects 413. In other embodiments, the vias 503 may be in direct electrical contact with the contact pads 415 and may be electrically connected to the interconnects 413 through the contact pads 415.

Referring to FIG. 5B, the wafer 500 is singulated along the scribe lines 403 (see FIG. 5A) to form individual dies 507. In some embodiments, the wafer 500 may be singulated into the individual dies 507, for example, by sawing, laser ablation, etching, a combination thereof, or the like.

Figure 6A:
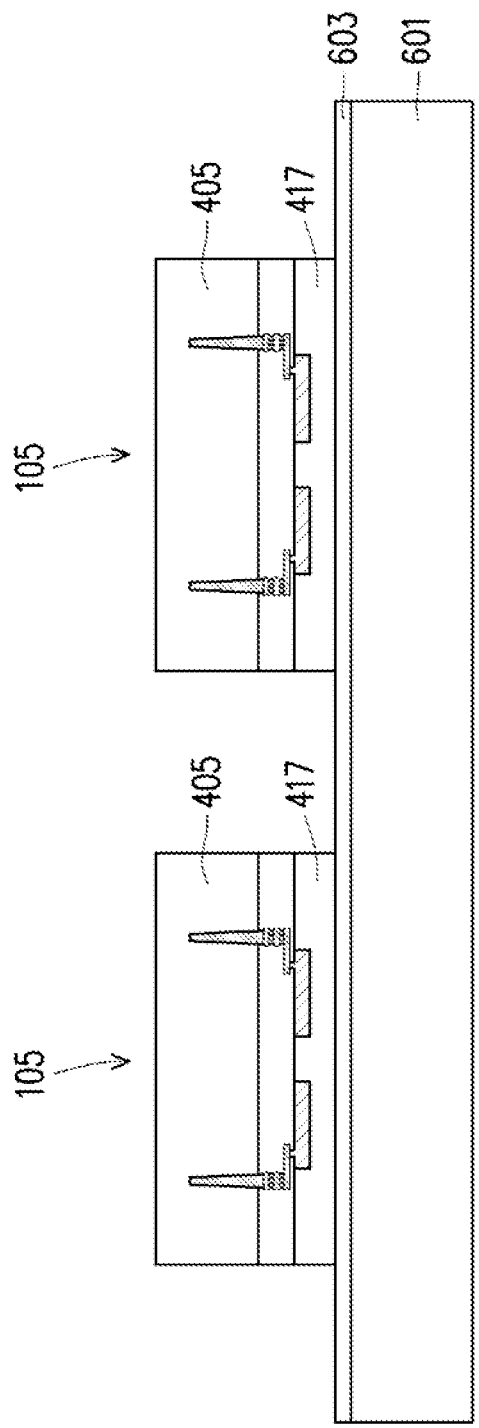

FIGS. 6A-6H illustrate cross-sectional views of various processing steps during fabrication of integrated circuit die structures (such as, for example, the IC die structures 101 and 301 illustrated in FIGS. 1A, 1B, 2, and 3, respectively) in accordance with some embodiments. Referring to FIG. 6A, the IC dies 105 bonded to a carrier 601 are illustrated. In some embodiments, the carrier 601 may comprise similar materials as the substrate 405 described above with reference to FIG. 4A, and the description is not repeated herein. In other embodiments, the carrier 601 may comprise a suitable insulating material. In some embodiments, the IC dies 105 may be similar to the IC dies 419 and may be formed using a method described above with reference to FIGS. 4A-4C, with similar features of the IC dies 419 and 105 being referred to with similar numerical references.

Referring further to FIG. 6A, an insulating layer 603 is formed over the carrier 601. In some embodiments, the insulating layer 603 may be formed using similar materials and methods as the insulating layer 417 described above with reference to FIG. 4B, and the description is not repeated herein. In some embodiments, the insulating layer 603 is planarized using a CMP process, a grinding process, an etching process, a combination thereof, or the like. In some embodiments, the IC dies 105 are bonded to the carrier 601 by bonding the insulating layers 417 of the IC dies 105 to the insulating layer 603. In some embodiments, the insulating layers 417 may be bonded to the insulating layer 603 using a direct bonding method, such a fusion bonding method. In some embodiments, surface treatment processes may be performed on the insulating layers 417 and the insulating layer 603 prior to bonding the insulating layers 417 to the insulating layer 603. In other embodiments, the insulating layers 417 may be bonded to the insulating layer 603 using other suitable bonding methods or using an adhesive. In some embodiments, an annealing process may be performed after bonding the IC dies 105 to the carrier 601 to strengthen the bond.

Figure 6B:
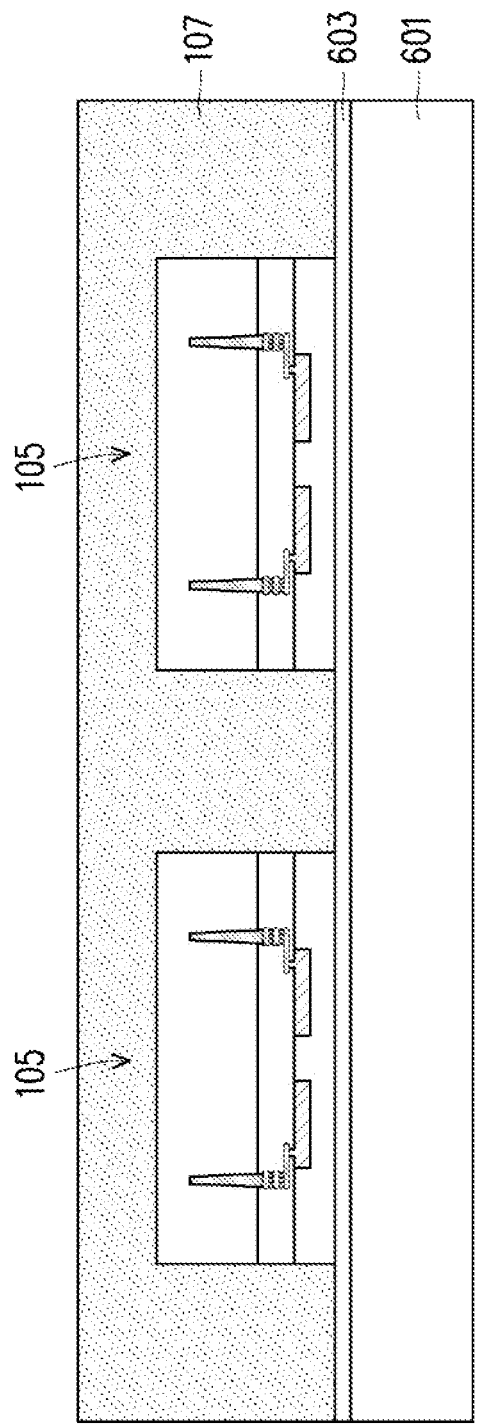

Referring to FIG. 6B, an encapsulant 107 is formed over and surrounding the IC dies 105. In some embodiments, the encapsulant 107 may be formed using similar materials and methods as the insulating layer 417 described above with reference to FIG. 4B, and the description is not repeated herein. In other embodiments, the encapsulant 107 may comprise a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 105.

Figure 6C:
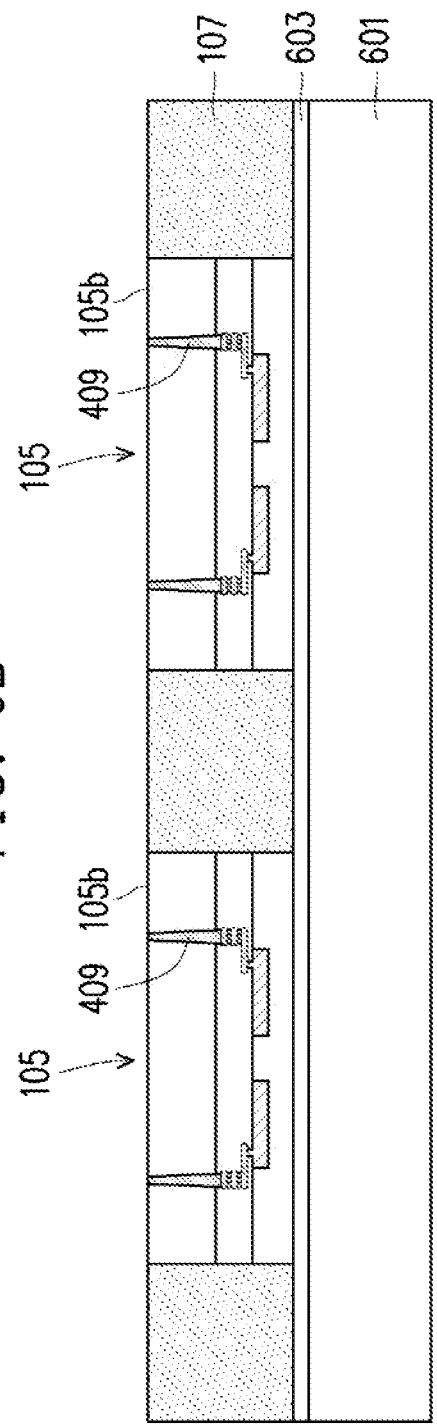

Referring to FIG. 6C, the encapsulant 107 and the IC dies 105 are planarized, such that backside surfaces 105b of the IC dies 105 are substantially level or coplanar with a topmost surface of the encapsulant 107. In some embodiments the encapsulant 107 and the IC dies 105 may be planarized using a CMP process, a grinding process, an etching process, a combination thereof, or the like. In some embodiment, the planarization process exposes the TVs 409, such that exposed surfaces of the TVs 409 are substantially level or coplanar with the backside surfaces 105b of the IC dies 105 and the topmost surface of the encapsulant 107.

Figure 6D:
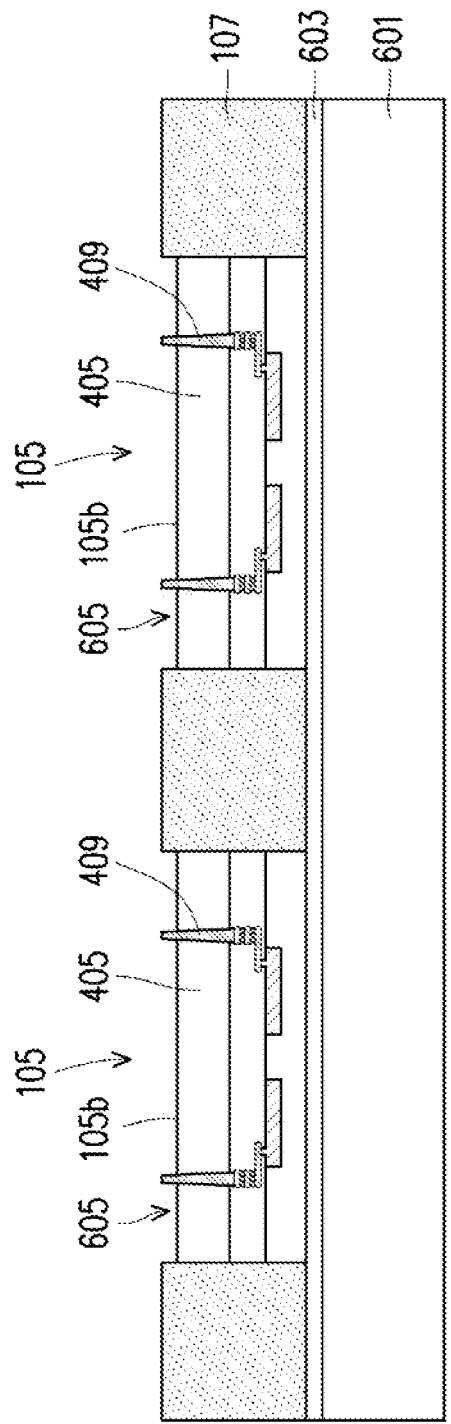

Referring to FIG. 6D, the backside surfaces 105b of the IC dies 105 are recessed below the topmost surface of the encapsulant 107 to form recesses 605. In some embodiments, the backside surfaces 105b of the IC dies 105 may be recessed using a suitable etching process, such as a selective dry or wet etching process that is selective to the material of the substrate 405. In some embodiments, sidewalls of TVs 409 are exposed within the recesses 605.

Figure 6E:
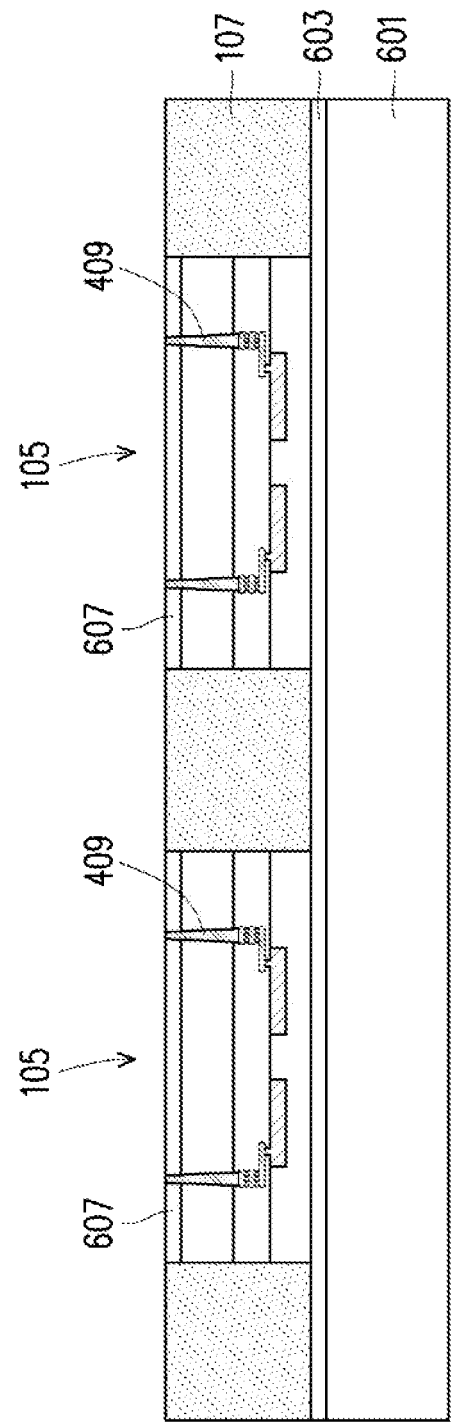

Referring to FIG. 6E, an insulating layer 607 is formed over the encapsulant 107 and the recesses 605 (see FIG. 6D). In some embodiments, the insulating layer 607 may be formed using similar materials and methods as the insulating layer 417 described above with reference to FIG. 4B, and the description is not repeated herein. In some embodiments, portions of the insulating layer 607 overfilling the recesses 605 are removed, such that topmost surfaces of remaining portions of the insulating layer 607 are substantially level or coplanar with the topmost surface of the encapsulant 107. In some embodiments, the portions of the insulating layer 607 overfilling the recesses 605 may be removed using a CMP process, a grinding process, an etching process, a combination thereof, or the like. In some embodiment, the removal process exposes the TVs 409, such that exposed surfaces of the TVs 409 are substantially level or coplanar with the topmost surfaces of the insulating layers 607 and the topmost surface of the encapsulant 107.

Referring to FIG. 6F, an insulating layer 609 is formed over the IC dies 105 and the encapsulant 107. In some embodiments, the insulating layer 609 may be formed using similar materials and methods as the insulating layer 417 described above with reference to FIG. 4B, and the description is not repeated herein. In some embodiments, the insulating layer 609 and the insulating layer 607 may comprise a same material. In other embodiments, the insulating layer 609 and the insulating layer 607 may comprise different materials. In some embodiments, bond pads 611 are formed in the insulating layer 609 in electrical contact with respective TVs 409. In some embodiments, bond pads 611 may be formed using similar materials and methods as the interconnects 413 described above with reference to FIG. 4A, and the description is not repeated herein. In some embodiments, the bond pads 611 are planarized, such that topmost surfaces of the bond pads 611 are substantially level or coplanar with the topmost surface of the insulating layer 609. In some embodiments, the bond pads 611 may be planarized using a CMP process, a grinding process, an etching process, a combination thereof, or the like.

Figure 6H:
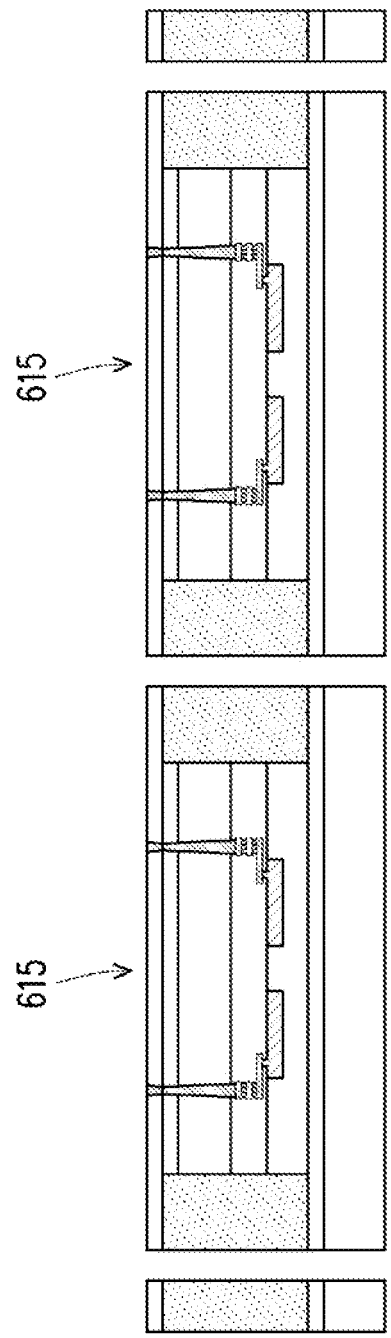

Referring to FIGS. 6G and 6H, the resulting structure is singulated to form individual IC die structures 615, which are intermediate structures in forming the IC die structures 101, in accordance with some embodiments. Referring first to FIG. 6G, the insulating layer 609, the encapsulant 107, the insulating layer 603 and the carrier 601 are patterned to form recesses 613. The recesses 613 are interposed between the adjacent IC dies 105 and partially extend into the carrier 601, such that the recesses 613 partially singulate the carrier 601. In some embodiments, the patterning process for forming the recesses may comprise suitable photolithography and etching methods.

Referring to FIG. 6H, the carrier 601 is thinned to remove un-singulated portions of the carrier 601 and form the individual IC die structures 615. In some embodiments, the carrier 601 may be thinned using a CMP process, a grinding process, an etching process, a combination thereof, or the like. In other embodiments, the singulation process may comprise sawing, laser ablation, etching, a combination thereof, or the like.

Figure 7A:
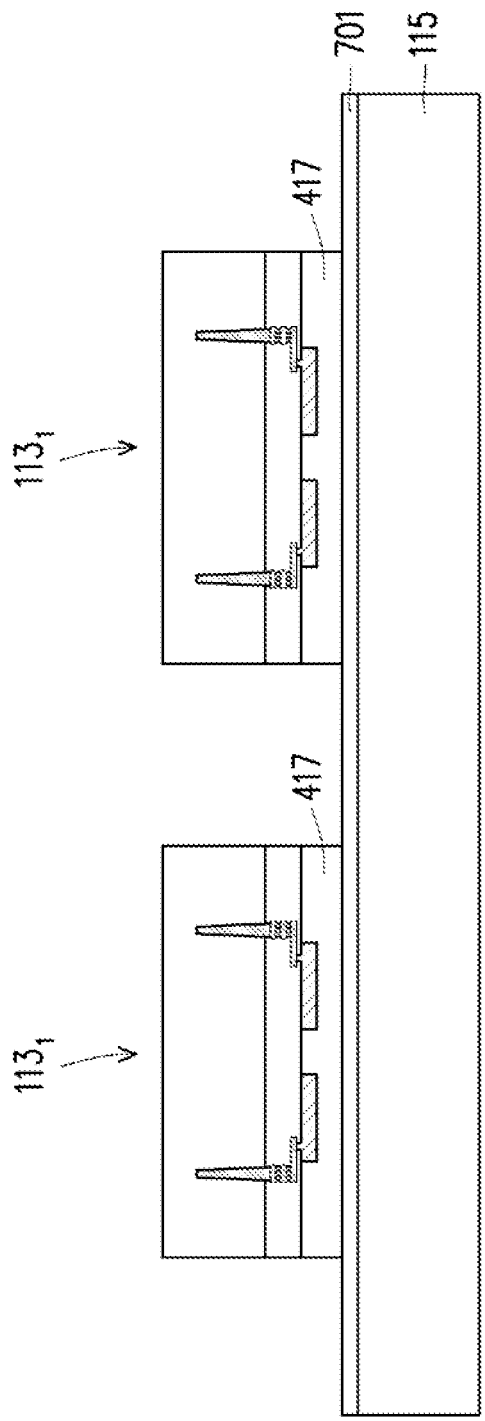

FIGS. 7A-7I illustrate cross-sectional views of various processing steps during fabrication of integrated circuit packages (such as, for example, the IC packages 100A and 100B illustrated in FIGS. 1A and 1B, respectively) in accordance with some embodiments. Referring to FIG. 7A, an insulating layer 701 is formed over a carrier 115. In some embodiments, the carrier 115 may be formed using similar materials and methods as the carrier 601 described above with reference to FIG. 6A, and the description is not repeated herein. In some embodiments, IC dies $113_1$ are bonded to the insulating layer 701. In some embodiments, the IC dies $113_1$ may be similar to the IC dies 419 and may be formed using a method described above with reference to FIGS. 4A-4C, with similar features of the IC dies $113_1$ and 419 being referred to with similar numerical references. In some embodiments, the IC dies $113_1$ are bonded to the insulating layer 701 by bonding the insulating layers 417 of the IC dies $113_1$ to the insulating layer 701. In some embodiments, the insulating layers 417 may be bonded to the insulating layer 701 using a direct bonding method, such a fusion bonding method. In some embodiments, surface treatment processes may be performed on the insulating layers 417 and the insulating layer 701 prior to bonding the insulating layers 417 to the insulating layer 701. In other embodiments, the insulating layers 417 may be bonded to the insulating layer 701 using other suitable bonding methods or using an adhesive. In some embodiments, an annealing process may be performed after bonding the IC dies $113_1$ to the carrier 115 to strengthen the bond.

Referring to FIG. 7B, an encapsulant $117_1$ is formed over and surrounding the IC dies $113_1$. In some embodiments, the encapsulant $117_1$ may be formed using similar materials and methods as the encapsulant 107 described above with reference to FIG. 6B, and the description is not repeated herein.

Referring to FIG. 7C, the encapsulant $117_1$ and the IC dies $113_1$ are planarized, such that backside surfaces $113_{1b}$ of the IC dies $113_1$ are substantially level or coplanar with a topmost surface of the encapsulant $117_1$. In some embodiments the encapsulant $117_1$ and the IC dies $113_1$ may be planarized using a CMP process, a grinding process, an etching process, a combination thereof, or the like. In some embodiment, the planarization process exposes the TVs 409, such that exposed surfaces of the TVs 409 are substantially level or coplanar with the backside surfaces $113_{1b}$ of the IC dies $113_1$ and the topmost surface of the encapsulant $117_1$.

Figure 7D:
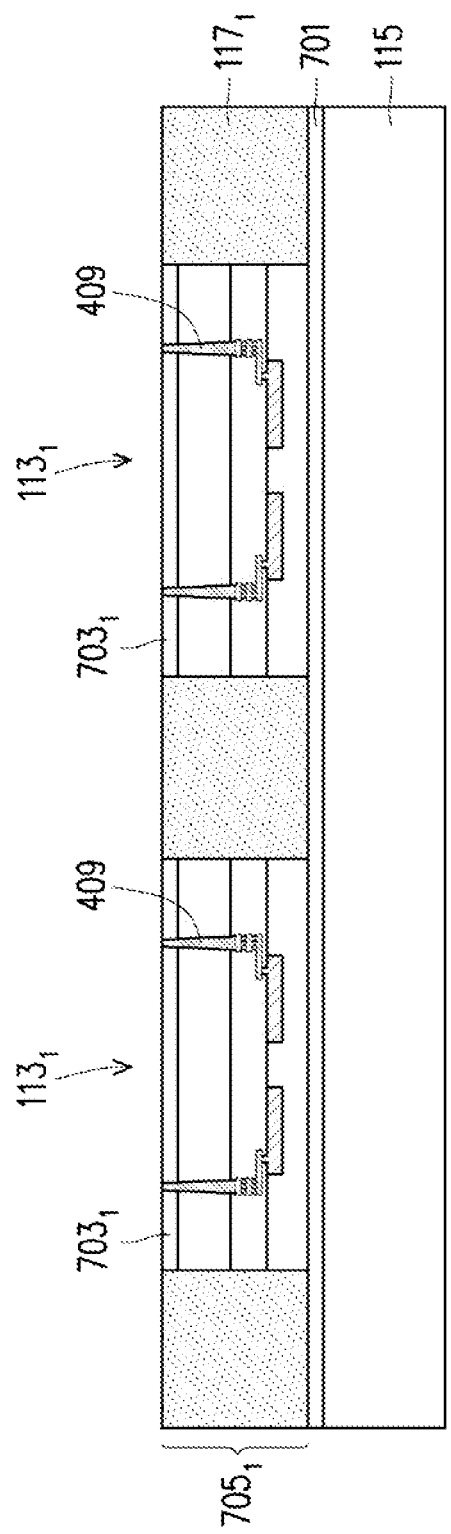

Referring to FIG. 7D, insulating layers $703_1$ are formed over the IC dies $113_1$, such that exposed surfaces of the TVs 409 are substantially level or coplanar with topmost surfaces of the insulating layers $703_1$ and the topmost surface of the encapsulant $117_1$. In some embodiments, the insulating layers $703_1$ may be formed using similar materials and methods as the insulating layers 607 described above with reference to FIGS. 6D and 6E, and the description is not repeated herein. The IC dies $113_1$, the insulating layers $703_1$, and the encapsulant $117_1$ form a tier 1 structure $705_1$ over the carrier 115.

Figure 7E:
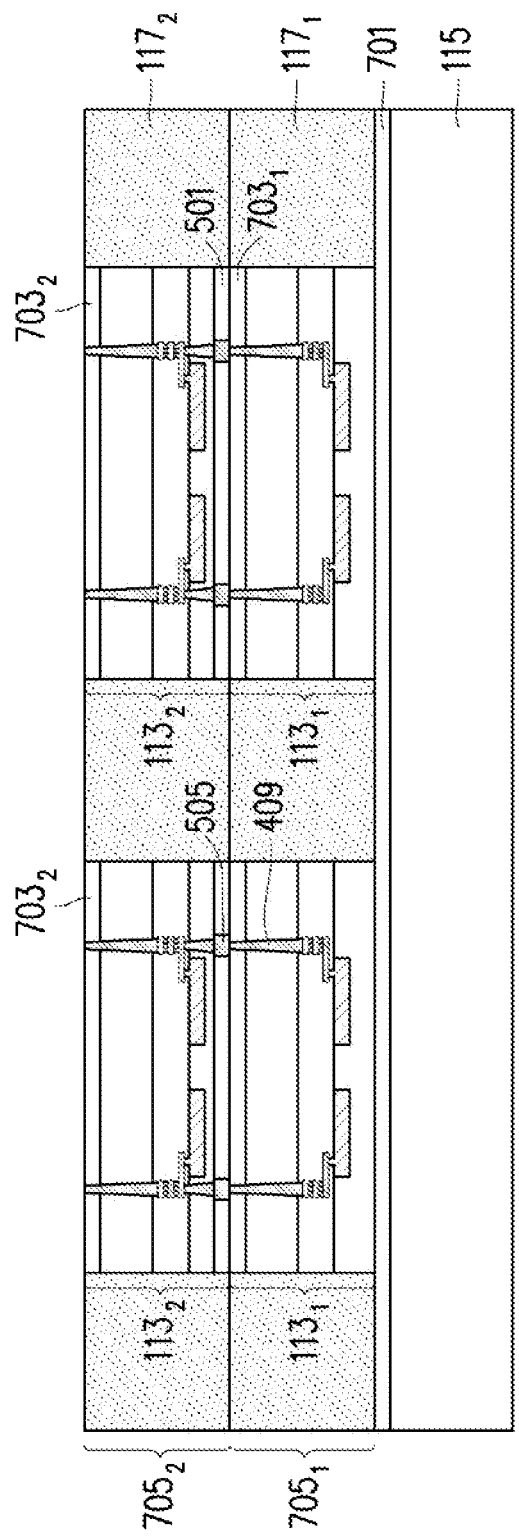

Referring to FIG. 7E, the IC dies $113_2$ are bonded to the IC dies $113_1$. In some embodiments, the IC dies $113_2$ may be similar to the IC dies 507 and may be formed using a method described above with reference to FIGS. 5A and 5B, with similar features of the IC dies $113_2$ and the IC dies 507 being referred to with similar numerical references. In some embodiments, the IC dies $113_2$ are bonded to the IC dies $113_1$ using a direct bonding method, such as a hybrid bonding method. In such embodiments, the TVs 409 of the IC dies $113_1$ are direct bonded to the bond pads 505 of the IC dies $113_2$, and the insulating layers $703_1$ of IC dies $113_1$ are direct bonded to the insulating layers 501 of the IC dies $113_2$. In some embodiments, after bonding the IC dies $113_2$ to the IC dies $113_1$, an annealing process may be performed to strengthen the bond between the IC dies $113_2$ and the IC dies $113_1$. The bond between the TVs 409 of the IC dies $113_1$ and the bond pads 505 of the IC dies $113_2$ provides an electrical connection between the IC dies $113_1$ and the IC dies $113_2$. In some embodiments, the TVs 409 of the IC dies $113_1$ and the bond pads 505 of the IC dies $113_2$ may comprise a same material. In other embodiments, the TVs 409 of the IC dies $113_1$ and the bond pads 505 of the IC dies $113_2$ may comprise different materials. In some embodiments, the insulating layers $703_1$ of IC dies $113_1$ and the insulating layers 501 of the IC dies $113_2$ may comprise a same material. In other embodiments, the insulating layers $703_1$ of IC dies $113_1$ and the insulating layers 501 of the IC dies $113_2$ may comprise different material.

Referring further to FIG. 7E, the IC dies $113_2$ are encapsulated in an encapsulant $117_2$ and insulating layers $703_2$ are formed over the IC dies $113_2$. In some embodiments, the encapsulant $117_2$ may be formed using similar material and methods as the encapsulant $117_1$, and the description is not repeated herein. In some embodiments, the insulating layers $703_2$ may be formed using similar material and methods as the insulating layers $703_1$, and the description is not repeated herein. The IC dies $113_2$, the insulating layers $703_2$, and the encapsulant $117_2$ form a tier 2 structure $705_2$ over the tier 1 structure $705_1$.

Figure 7F:
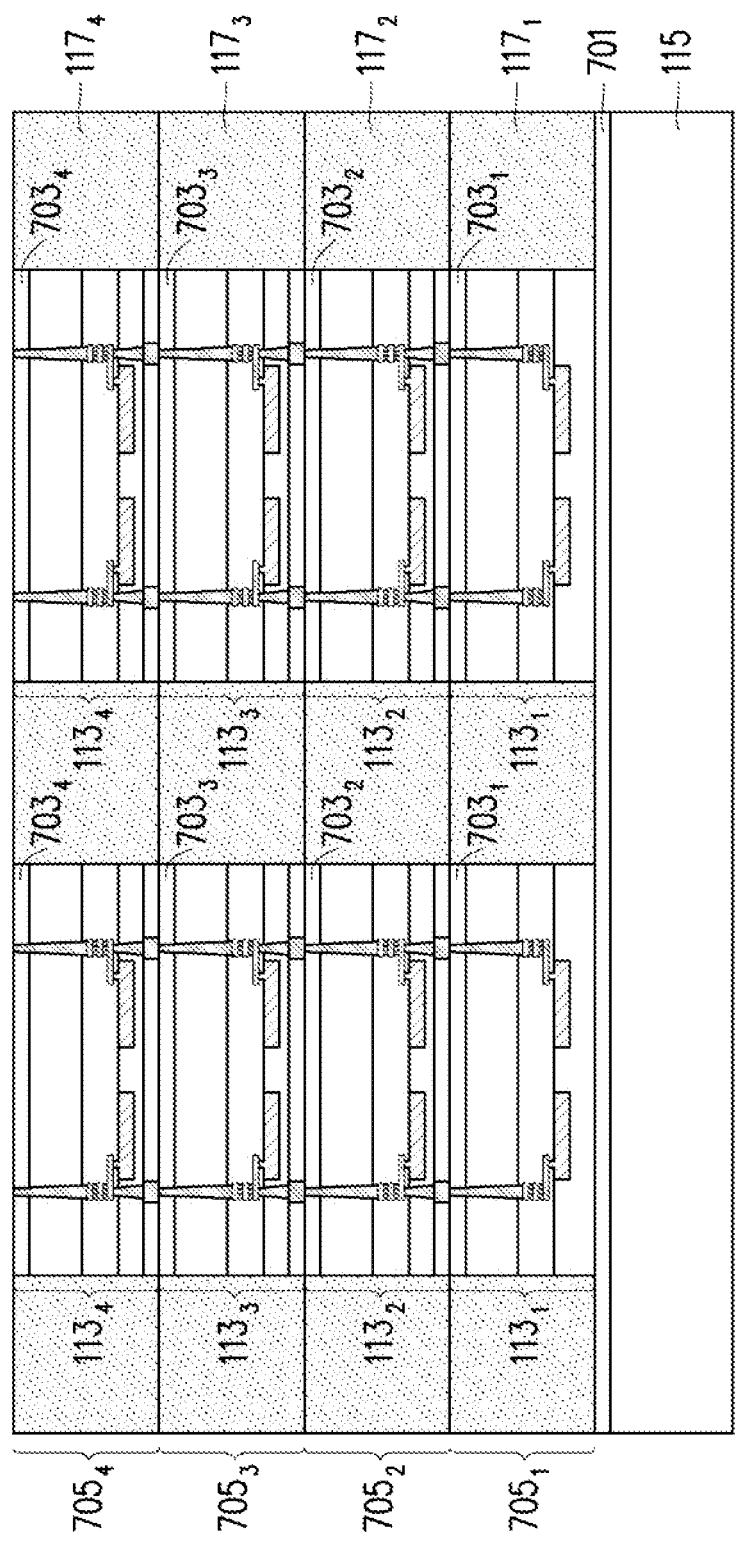

Referring to FIG. 7F, a tier 3 structure $705_3$ comprising IC dies $113_3$, insulating layers $703_3$, and encapsulant $117_3$ is formed over the tier 2 structure $705_2$. In some embodiments, the IC dies $113_3$ may be similar to the IC dies 507 and may be formed using a method described above with reference to FIGS. 5A and 5B, with similar features of the IC dies $113_3$ and the IC dies 507 being referred to with similar numerical references. In some embodiments, the encapsulant $117_3$ may be formed using similar material and methods as the encapsulant $117_1$, and the description is not repeated herein. In some embodiments, the insulating layers $703_3$ may be formed using similar material and methods as the insulating layers $703_1$, and the description is not repeated herein. In some embodiments, the tier 3 structure $705_3$ may be formed using similar methods as the tier 2 structure $705_2$ described above with reference to FIG. 7E, and the description is not repeated herein.

Referring further to FIG. 7F, a tier 4 structure $705_4$ comprising IC dies $113_4$, insulating layers $703_4$, and encapsulant $117_4$ is formed over the tier 3 structure $705_3$. In some embodiments, the IC dies $113_4$ may be similar to the IC dies 507 and may be formed using a method described above with reference to FIGS. 5A and 5B, with similar features of the IC dies $113_4$ and the IC dies 507 being referred to with similar numerical references. In some embodiments, the encapsulant $117_4$ may be formed using similar material and methods as the encapsulant $117_1$, and the description is not repeated herein. In some embodiments, the insulating layers $703_4$ may be formed using similar material and methods as the insulating layers $703_1$, and the description is not repeated herein. In some embodiments, the tier 4 structure $705_4$ may be formed using similar methods as the tier 2 structure $705_2$ described above with reference to FIG. 7E, and the description is not repeated herein.

Figure 7G:
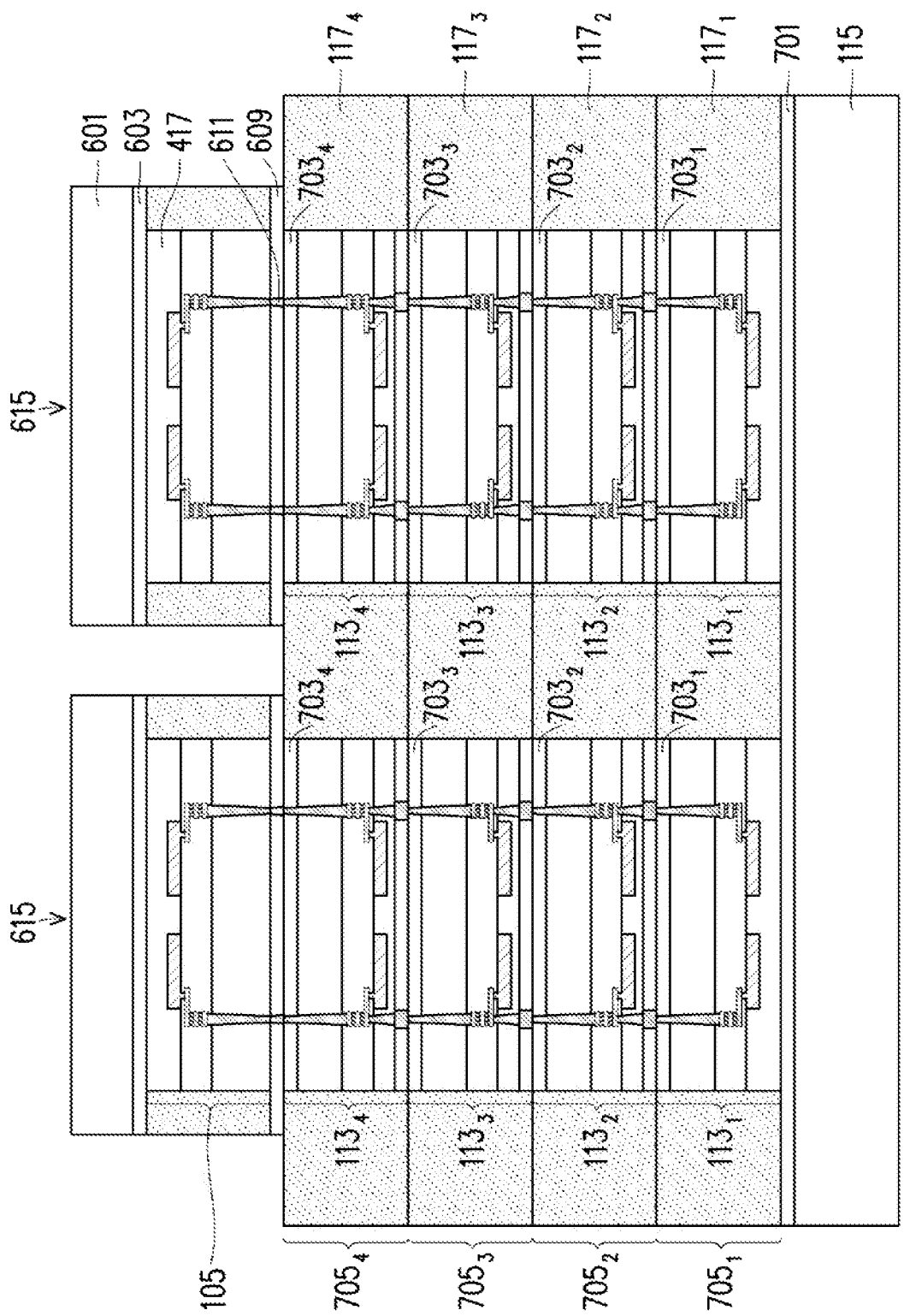

Referring to FIG. 7G, the IC die structures 615 (see FIG. 6H) are bonded to IC dies $113_4$. In some embodiments, IC die structures 615 are bonded to IC dies $113_4$ using a direct bonding method, such as a hybrid bonding method. In such embodiments, the TVs 409 of the IC dies $113_4$ are direct bonded to the bond pads 611 of the IC die structures 615, and the insulating layers $703_4$ of IC dies $113_4$ are direct bonded to the insulating layers 609 of the IC die structures 615. In some embodiments, after bonding the IC die structures 615 to the IC dies $113_4$, an annealing process may be performed to strengthen the bond between the IC die structures 615 and the IC dies $113_4$. The bond between the TVs 409 of the IC dies $113_4$ and the bond pads 611 of the IC die structures 615 provides an electrical connection between the IC die structures 615 and IC dies $113_4$. In some embodiments, the TVs 409 of the IC dies $113_4$ and the bond pads 611 of the IC die structures 615 may comprise a same material. In other embodiments, the TVs 409 of the IC dies $113_4$ and the bond pads 611 of the IC dies structures 615 may comprise different materials. In some embodiments, the insulating layers 609 of the IC die structures 615 and the insulating layers $703_4$ of the IC dies $113_4$ may comprise a same material. In other embodiments, the insulating layers 609 of the IC die structures 615 and the insulating layers $703_4$ of the IC dies $113_4$ may comprise different materials.

Figure 7H:
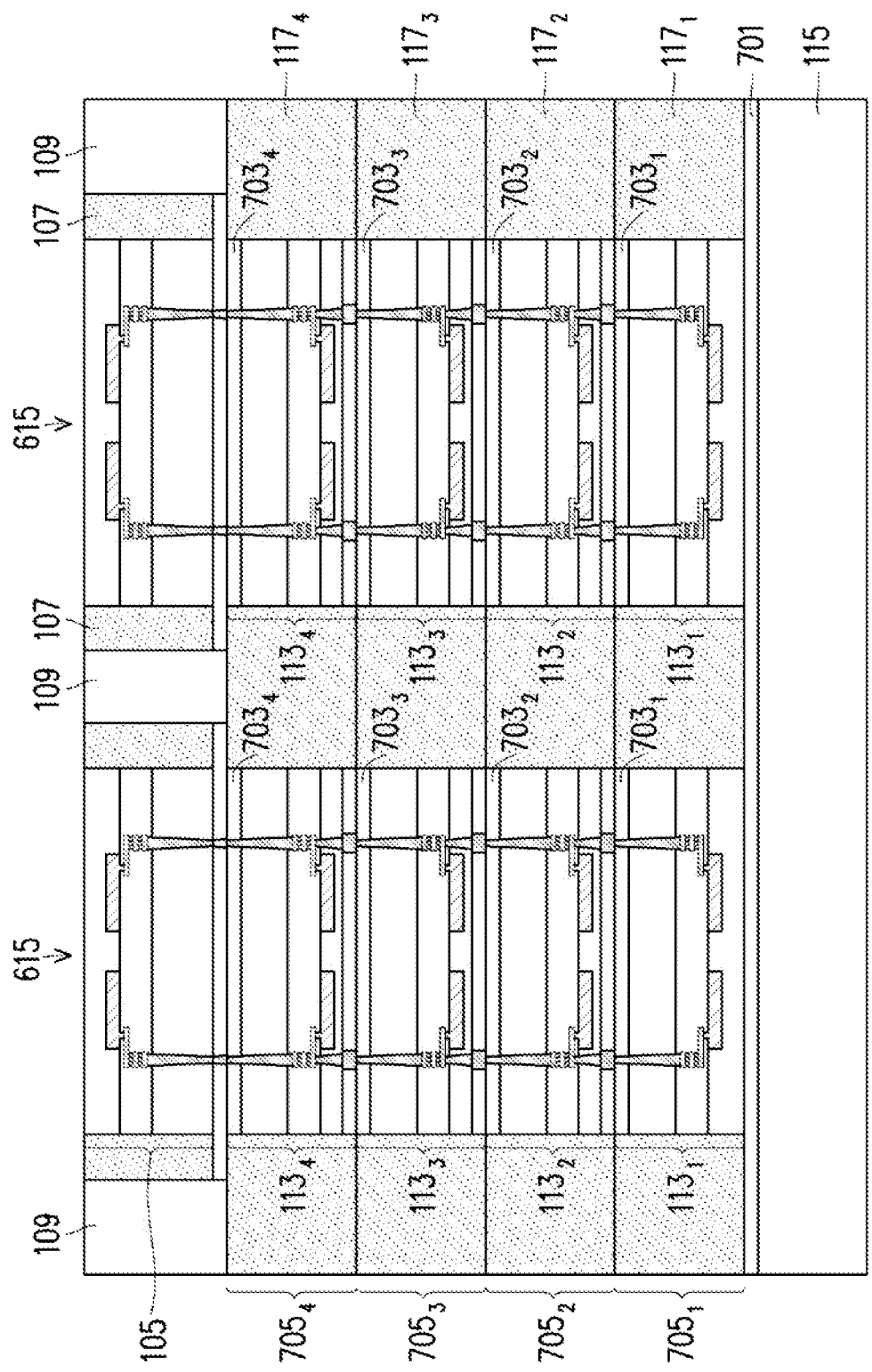

Referring to FIG. 7H, an encapsulant 109 is formed over and between the IC die structures 615. In some embodiments, the encapsulant 109 may be formed using similar materials and methods as the encapsulant 107 described above with reference to FIG. 6B, and the description is not repeated herein. In some embodiments, the carriers 601 and the insulating layers 603 (see FIG. 7G) of the IC die structures 615 and portions of the encapsulant 109 are removed to expose the insulating layers 417 of the IC dies 105, such that exposed surfaces of the insulating layers 417 are substantially level or coplanar with a topmost surface of the encapsulant 109. In some embodiments, the carriers 601, the insulating layers 603 and portions of the encapsulant 109 may be removed using a CMP process, a grinding process, an etching process, a combination thereof, or the like.

Figure 7I:
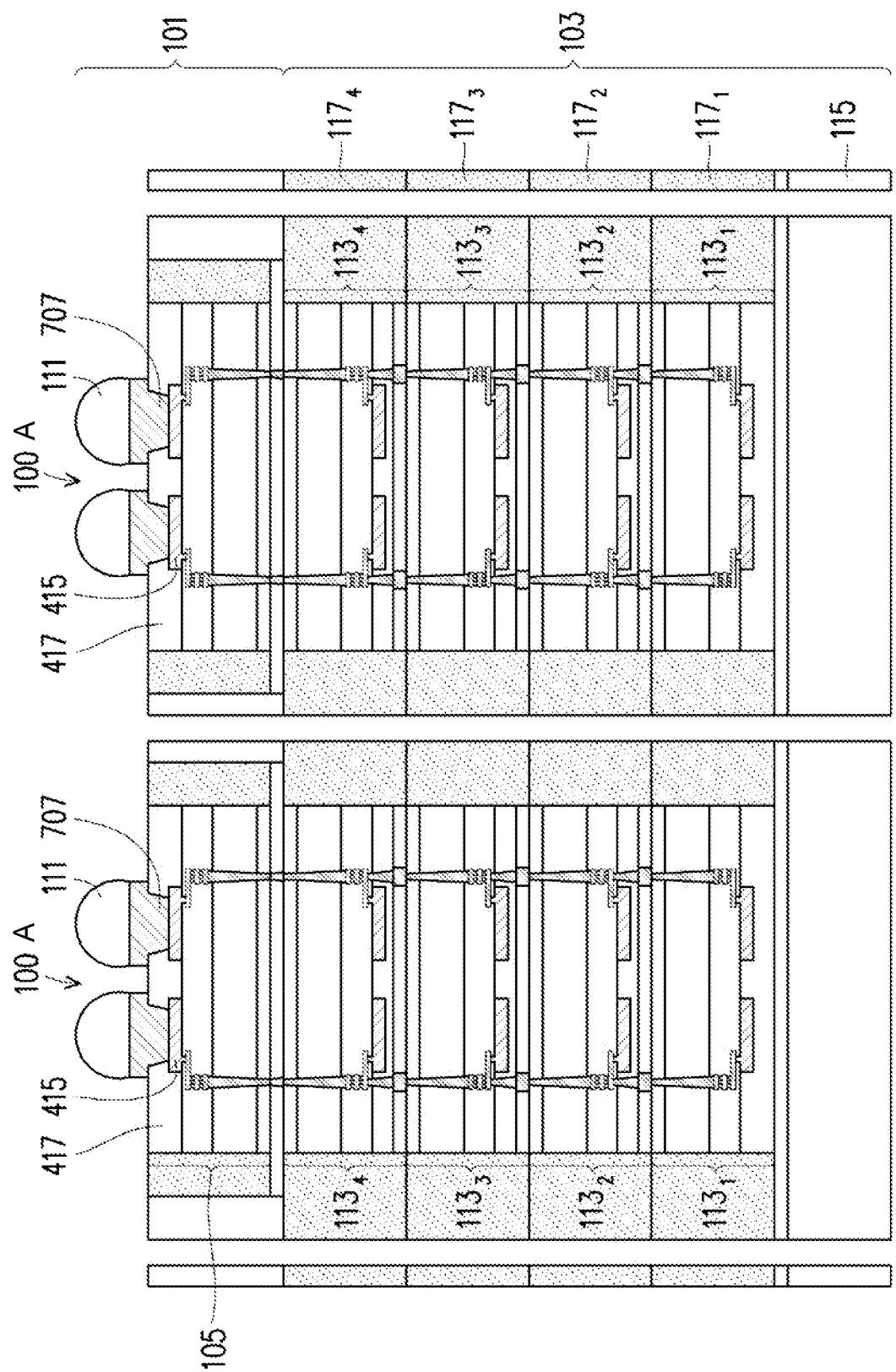

Referring to FIG. 7I, underbump metallizations (UBMs) 707 are formed over and electrically coupled to the respective contact pads 415 of the IC dies 105. In some embodiments, openings are formed through the insulating layers 417 to expose the contact pads 415 and suitable conductive materials are deposited in the openings to form the UBMs 707. In some embodiments, the UBMs 707 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 707. Any suitable materials or layers of material that may be used for the UBMs 707 are fully intended to be included within the scope of the current application. In some embodiments, connectors 111 are formed over and electrically coupled to the UBMs 707. In some embodiments, the connectors 111 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments where the connectors 111 are formed of solder materials, a reflow process may be performed in order to shape the solder material into the desired bump shapes.

Referring further to FIG. 7I, after forming the connectors 111, the resulting structure is singulated into individual IC packages 100A, such that each IC packages 100A comprises the IC die 105 with the respective stack of IC dies $113_1$-$113_4$. In some embodiments, the singulation process may comprise sawing, laser ablation, etching, a combination thereof, or the like. In other embodiments, the carrier 115 may be removed before performing the singulation process. In such embodiments, the singulation process forms individual IC packages, such as the IC package 100B illustrated in FIG. 1B. In some embodiments, the carrier 115 may be removed using a CMP process, a grinding process, an etching process, a combination thereof, or the like.

FIGS. 8A-8E illustrate cross-sectional views of various processing steps during fabrication of integrated circuit packages (such as, for example, IC package 200 illustrated in FIG. 2) in accordance with some embodiments. To highlight differences between the embodiment illustrated in FIGS. 8A-8E and the embodiment illustrated in FIGS. 7A-7I, the common features of these embodiments are labeled by same numerical references. Furthermore, the detailed descriptions of the common features (described above with reference to FIGS. 7A-7I) are not repeated herein.

Figure 8A:
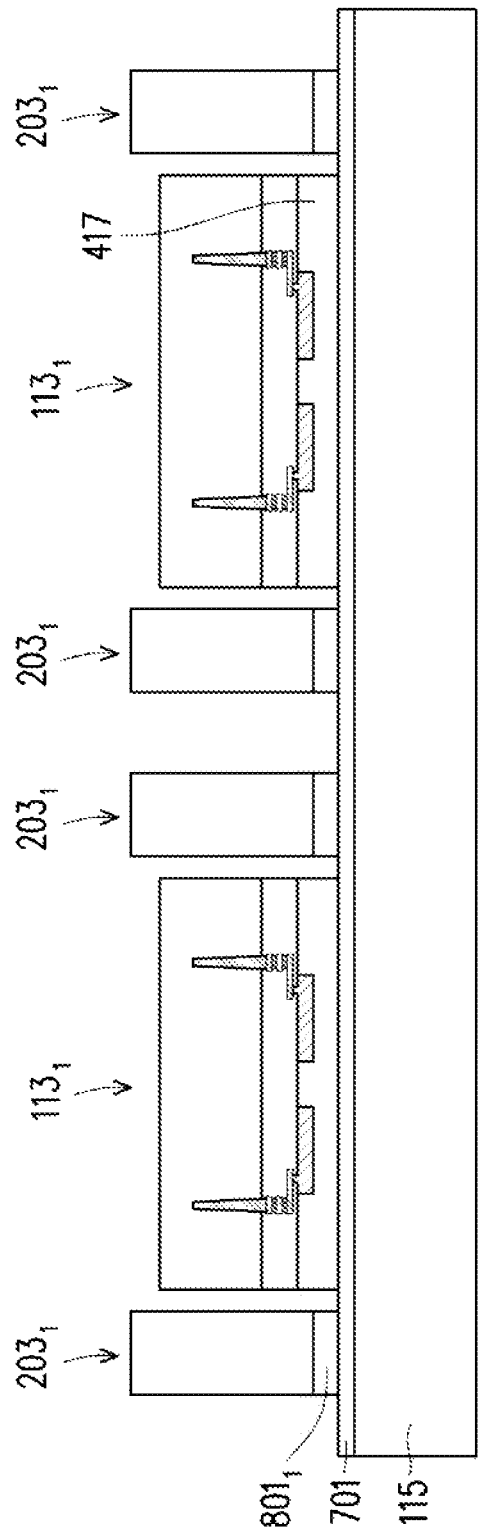

Referring to FIG. 8A, an insulating layer 701 is formed over a carrier 115, and IC dies $113_1$ are bonded to the insulating layer 701. In some embodiments, the IC dies $113_1$ are bonded to the insulating layer 701 by bonding the insulating layers 417 of the IC dies $113_1$ to the insulating layer 701. In some embodiments, the insulating layers 417 may be bonded to the insulating layer 701 using a direct bonding method, such a fusion bonding method. In some embodiments, surface treatment processes may be performed on the insulating layers 417 and the insulating layer 701 prior to bonding the insulating layers 417 to the insulating layer 701. In other embodiments, the insulating layers 417 may be bonded to the insulating layer 701 using other suitable bonding methods or using an adhesive. In some embodiments, an annealing process may be performed after bonding the IC dies $113_1$ to the carrier 115 to strengthen the bond.

Referring further to FIG. 8A, dummy dies $203_1$ are bonded to the insulating layer 701, such that each IC die $113_1$ is interposed between adjacent dummy dies $203_1$. In some embodiments, the dummy dies $203_1$ may comprise a same material as the substrate 405 of the IC dies $113_1$. In some embodiments, dummy dies $203_1$ may not comprise active and/or passive devices, and may not provide additional electrical functionality to the resulting IC package 200 (see FIG. 2). In some embodiments, each dummy die $203_1$ may comprise an insulating layer $801_1$ on one side. In some embodiments, the insulating layers $801_1$ may be formed using similar materials and methods as the insulating layer 417 described above with reference to FIG. 4B, and description is not repeated herein. In some embodiments, the insulating layers $801_1$ and the insulating layer 701 may comprise a same material. In other embodiments, the insulating layers $801_1$ and the insulating layer 701 may comprise different material.

In some embodiments, dummy dies $203_1$ are bonded to the insulating layer 701 by bonding the insulating layers $801_1$ of the dummy dies $203_1$ to the insulating layer 701. In some embodiments, the insulating layers $801_1$ may be bonded to the insulating layer 701 using a direct bonding method, such a fusion bonding method. In some embodiments, surface treatment processes may be performed on the insulating layers $801_1$ and the insulating layer 701 prior to bonding the insulating layers $801_1$ to the insulating layer 701. In other embodiments, the insulating layers $801_1$ may be bonded to the insulating layer 701 using other suitable bonding methods or using an adhesive. In some embodiments, an annealing process may be performed after bonding the dummy dies $203_1$ to the carrier 115 to strengthen the bond.

Figure 8B:
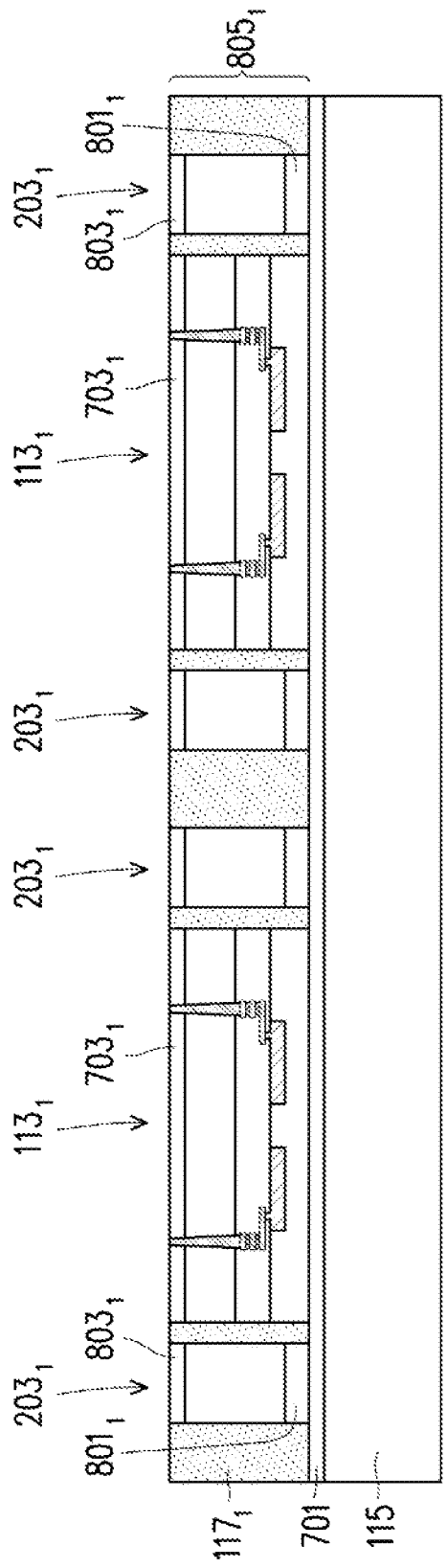

Referring to FIG. 8B, the IC dies $113_1$ and the dummy dies $203_1$ are encapsulated in an encapsulant $117_1$. Subsequently, insulating layers $703_1$ are formed over the IC dies $113_1$, and insulating layers $803_1$ are formed over the dummy dies $203_1$. In some embodiments, the insulating layers $803_1$ may be formed using similar materials and methods as the insulating layers $703_1$, and the description is not repeated herein. In some embodiments, the insulating layers $803_1$ and the insulating layers $703_1$ may comprise a same material. In other embodiments, the insulating layers $803_1$ and the insulating layers $703_1$ may comprise different materials. The IC dies $113_1$ with corresponding insulating layers $703_1$, the dummy dies $203_1$ with corresponding insulating layers $803_1$, and the encapsulant $117_1$ form a tier 1 structure $805_1$ over the carrier 115.

Figure 8C:
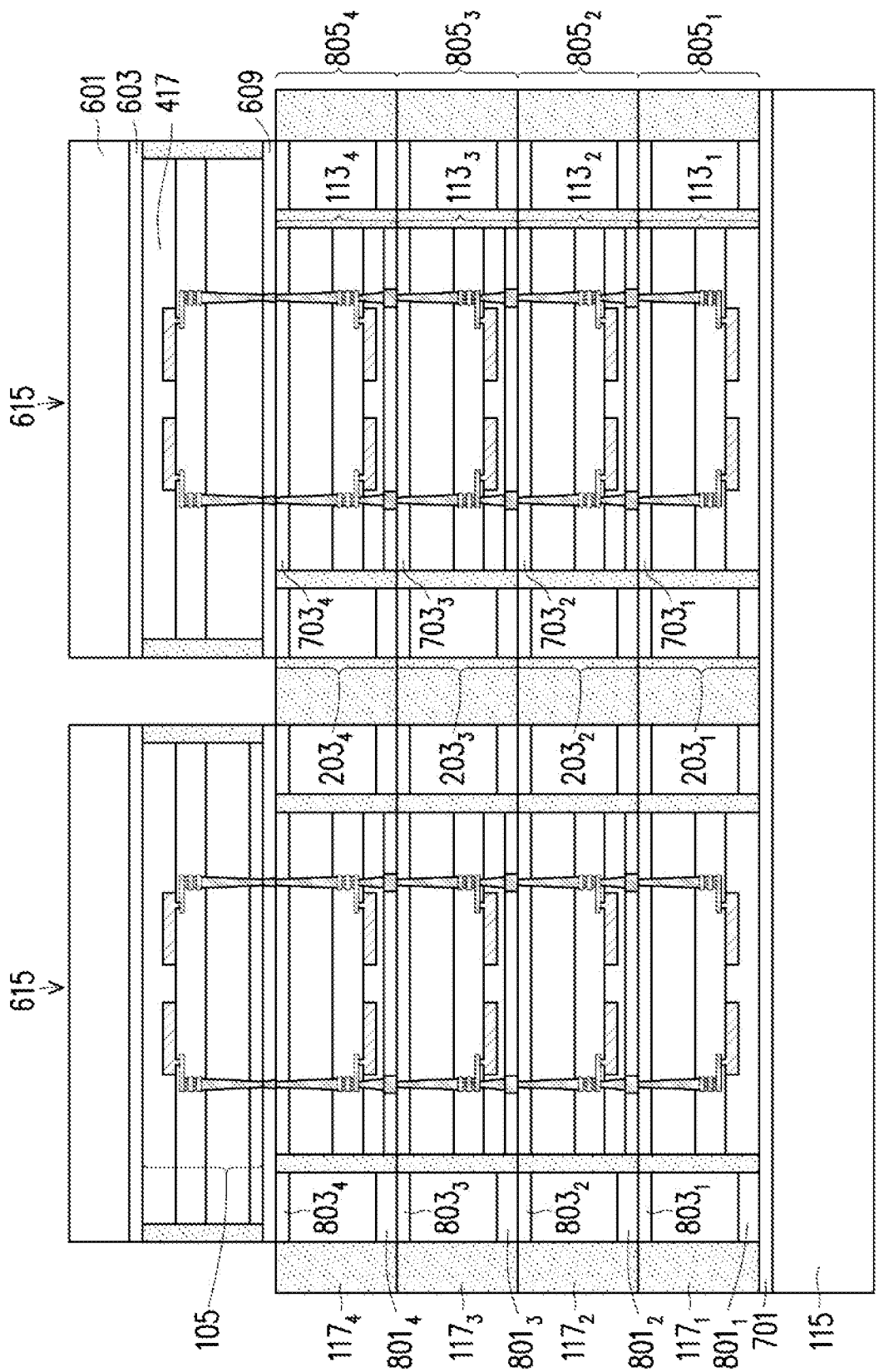

Referring to FIG. 8C, the IC dies $113_2$ are bonded to the IC dies $113_1$, and dummy dies $203_2$ are bonded to the dummy dies $203_1$. Subsequently, the IC dies $113_2$ and the dummy dies $203_2$ are encapsulated in an encapsulant $117_2$, insulating layers $703_2$ are formed over the IC dies $113_2$, insulating layers $803_2$ are formed over the dummy dies $203_2$. In some embodiments, the dummy dies $203_2$ may be formed using similar materials and methods as the dummy dies $203_1$ described above with reference to FIGS. 8B, and the description is not repeated herein. In some embodiments, the dummy dies $203_2$ may be bonded to the dummy dies $203_1$ by bonding the insulator layers $801_2$ of the dummy dies $203_2$ to insulating layers $803_1$ of the dummy dies $203_1$. In some embodiments, the insulating layers $801_2$ may be bonded to the insulating layers $803_1$ using a direct bonding method, such a fusion bonding method. In some embodiments, surface treatment processes may be performed on the insulating layers $801_2$ and the insulating layers $803_1$ prior to bonding the insulating layers $801_2$ to the insulating layer $803_1$. Subsequently, an annealing process may be performed to strengthen the bond between the insulating layers $801_2$ and the insulating layer $803_1$. In some embodiments, the insulating layers $803_2$ may be formed using similar materials and methods as the insulating layers $703_2$, and the description is not repeated herein. In some embodiments, the insulating layers $803_2$ and the insulating layers $703_2$ may comprise a same material. In other embodiments, the insulating layers $803_2$ and the insulating layers $703_2$ may comprise different materials. The IC dies $113_2$ with corresponding insulating layers $703_2$, the dummy dies $203_2$ with corresponding insulating layers $803_2$, and the encapsulant $117_2$ form a tier 2 structure $805_2$ over the tier 1 structure $805_1$.

Referring further to FIG. 8C, a tier 3 structure $805_3$ comprising IC dies $113_3$ with corresponding insulating layers $703_3$, the dummy dies $203_3$ with corresponding insulating layers $803_3$, and the encapsulant $117_3$ is formed over the tier 2 structure $805_2$. In some embodiments, the dummy dies $203_3$ may be formed using similar materials and methods as the dummy dies $203_1$ described above, and the description is not repeated herein. In some embodiments, the tier 3 structure $805_3$ may be formed using similar methods as the tier 2 structure $805_2$ described above, and the description is not repeated herein. Subsequently, a tier 4 structure $805_4$ comprising IC dies $113_4$ with corresponding insulating layers $703_4$, the dummy dies $203_4$ with corresponding insulating layers $803_4$, and the encapsulant $117_4$ is formed over the tier 3 structure $805_3$. In some embodiments, the dummy dies $203_4$ may be formed using similar materials and methods as the dummy dies $203_1$ described above, and the description is not repeated herein. In some embodiments, the tier 4 structure $805_4$ may be formed using similar methods as the tier 2 structure $805_2$ described above, and the description is not repeated herein. Subsequently, the IC die structures 615 (see FIG. 6H) are bonded to IC dies $113_4$ as described above with reference to FIG. 7G, and the description is not repeated herein.

Referring to FIG. 8D, an encapsulant 109 is formed over and between the IC die structures 615. In some embodiments, the carriers 601 and the insulating layers 603 of the IC die structures 615 (see FIG. 8C), and portions of the encapsulant 109 are removed to expose the insulating layers 417 of the IC dies 105, such that exposed surfaces of the insulating layers 417 are substantially level or coplanar with a topmost surface of the encapsulant 109. In some embodiments, the carriers 601, the insulating layers 603 and portions of the encapsulant 109 may be removed using a CMP process, a grinding process, an etching process, a combination thereof, or the like.

Figure 8E:
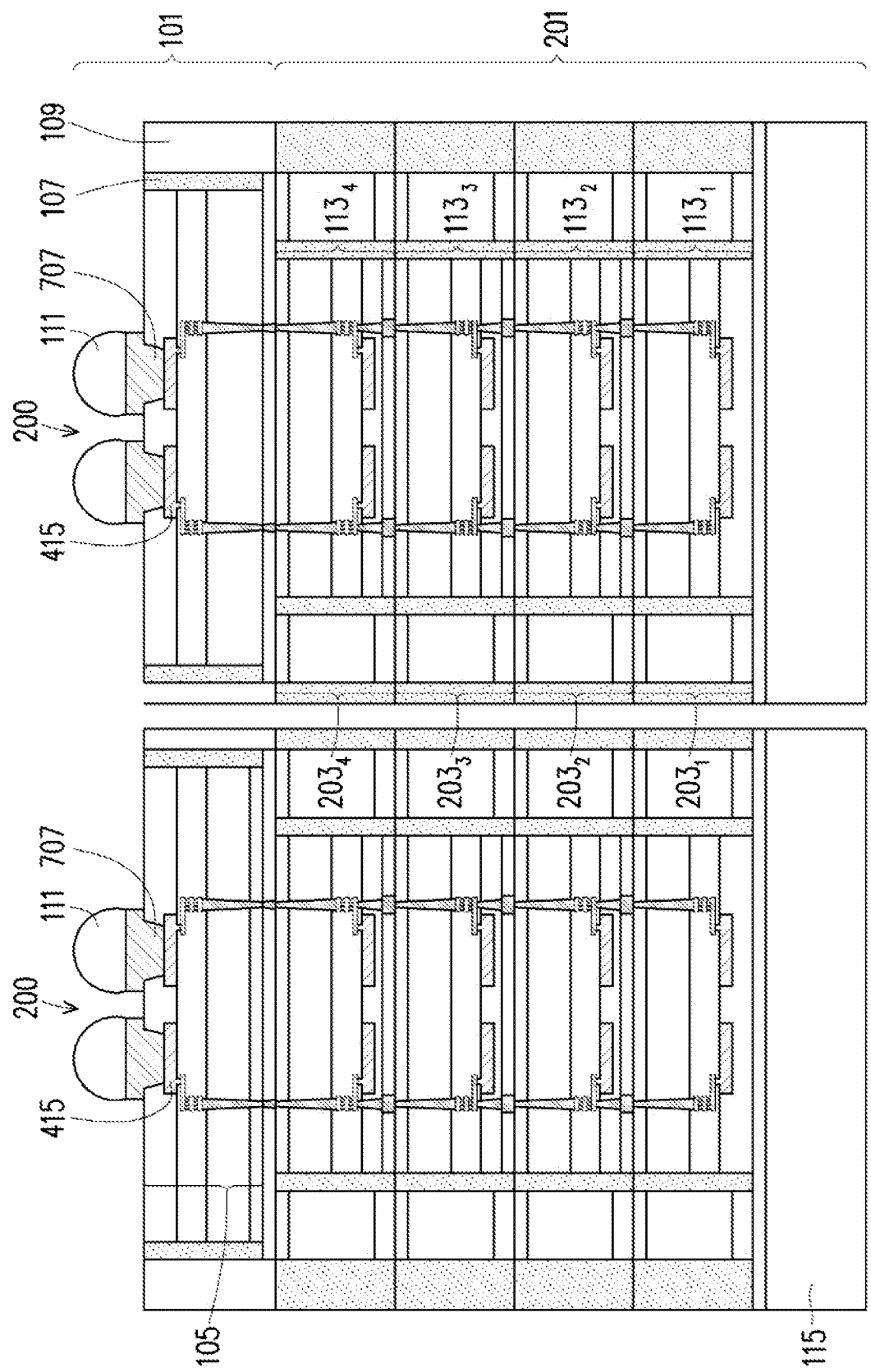

Referring to FIG. 8E, UBMs 707 are formed over and electrically coupled to the respective contact pads 415 of the IC dies 105, and connectors 111 are formed over and electrically coupled to the UBMs 707 as described above with reference to FIG. 7I, and the description is not repeated herein.

Referring further to FIG. 8E, after forming the connectors 111, the resulting structure is singulated into individual IC packages 200, such that each IC packages 200 comprises the IC die 105 with the respective stack of IC dies $113_1$-$113_4$ and the respective stacks of the dummy dies $203_1$-$203_4$. In some embodiments, the singulation process may comprise sawing, laser ablation, etching, a combination thereof, or the like. In other embodiments, the carrier 115 may be removed before performing the singulation process. In such embodiments, the carrier 115 is omitted from the IC packages 200. In some embodiments, the carrier 115 may be removed using a CMP process, a grinding process, an etching process, a combination thereof, or the like.

FIGS. 9A-9D illustrate cross-sectional views of various processing steps during fabrication of integrated circuit packages (such as, for example, the IC package 300 illustrated in FIG. 3) in accordance with some embodiments. To highlight differences between the embodiment illustrated in FIGS. 9A-9D and the embodiment illustrated in FIGS. 7A-7I, the common features of these embodiments are labeled by same numerical references. Furthermore, the detailed descriptions of the common features (described above with reference to FIGS. 7A-7I) are not repeated herein. In the embodiment illustrated in FIGS. 7A-7I, the IC dies 105 are bonded to the respective stacks of IC dies $113_1$-$113_4$, such that the stacks of IC dies $113_1$-$113_4$ are parts of the un-singulated wafer (see, for example, FIG. 7G), while the IC dies 105 are parts of the singulated die structures 615 (see, for example, FIG. 7G). As described below in greater detail, in the embodiment illustrated in FIGS. 9A-9D, the IC dies 105 are bonded to the stacks of IC dies $113_1$-$113_4$, such that the stacks of IC dies $113_1$-$113_4$ are parts of the singulated die structure (see, for example, FIG. 9B), while the IC dies 105 are parts of the un-singulated wafer (see, for example, FIG. 9B).

Figure 9A:
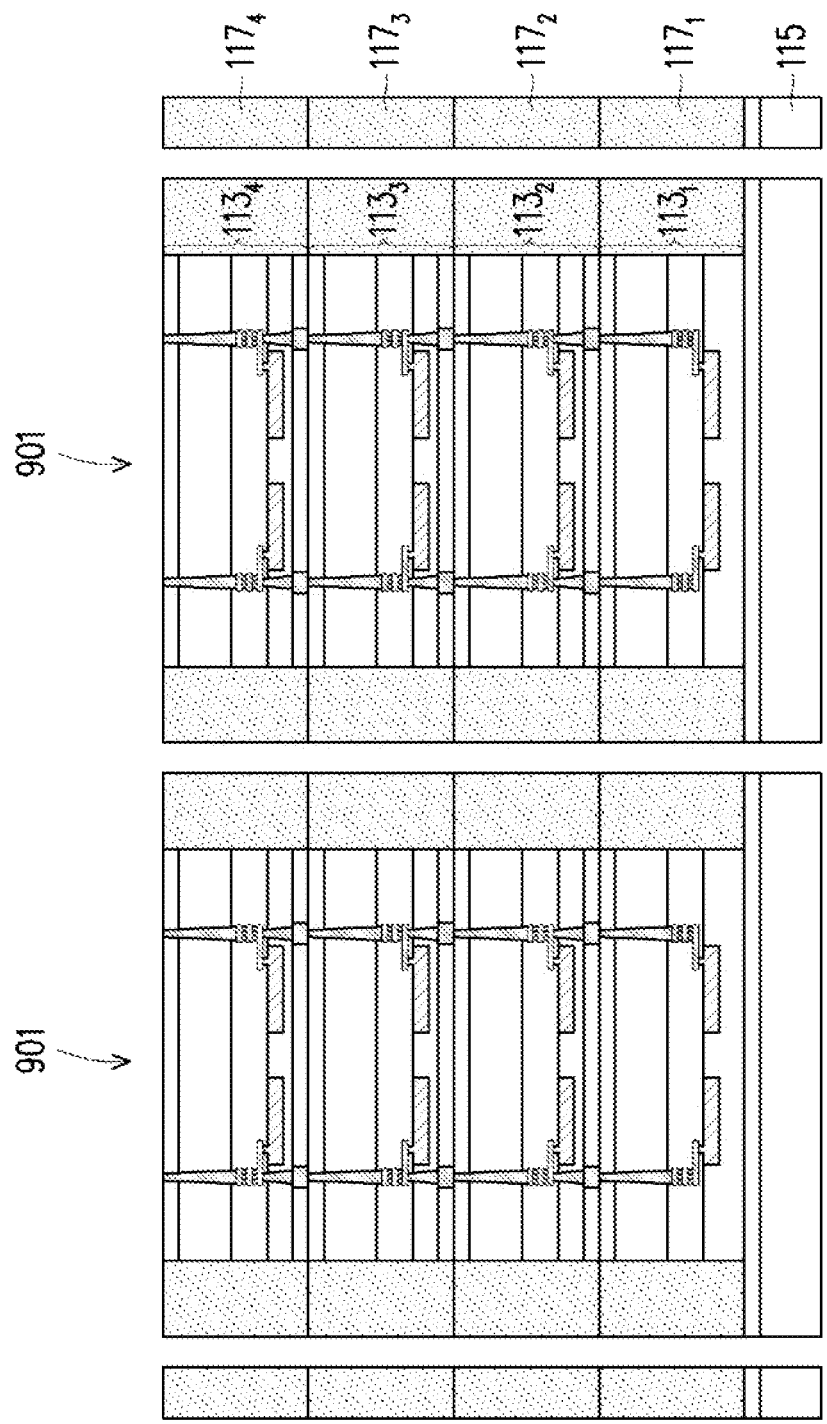

Referring to FIG. 9A, in some embodiments, the process starts with singulating the structure illustrated in FIG. 7F to form individual die structures 901. In some embodiments, the singulation process may comprise sawing, laser ablation, etching, a combination thereof, or the like.

Figure 9B:
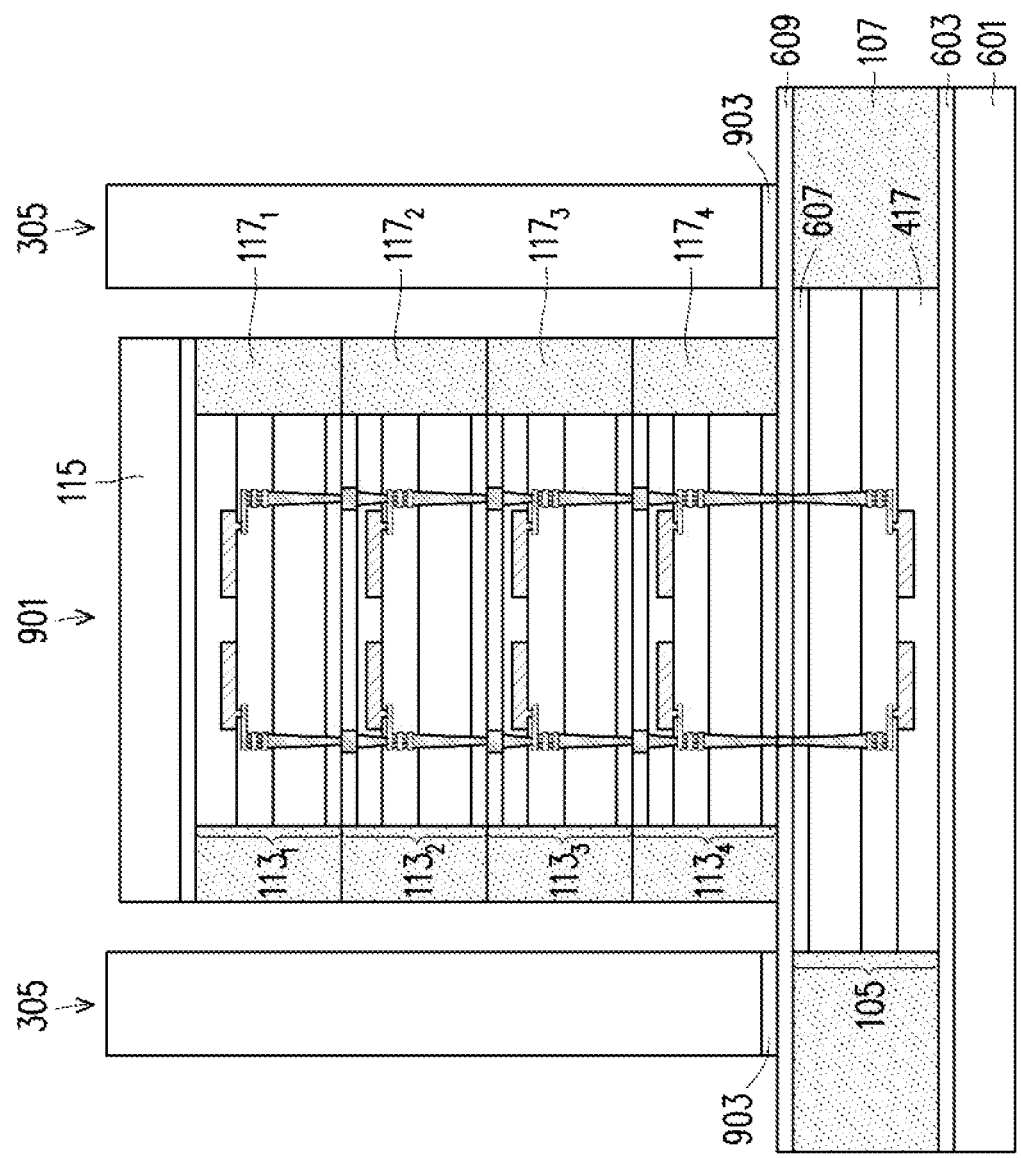

Referring to FIG. 9B, in some embodiments, the IC die structures 901 are bonded to respective IC dies 105, while the IC dies 105 are still part of the un-singulated wafer as shown in FIG. 6F. In some embodiments, the IC die structures 901 are bonded to respective IC dies 105 as described above with reference to FIG. 7G, and the description is not repeated herein.

Referring further to FIG. 9B, dummy dies 305 are bonded to the insulating layer 609 such that each IC die structure 901 is interposed between adjacent dummy dies 305. In some embodiments, the dummy dies 305 may be formed using similar materials and methods as the dummy dies $203_1$ described above with reference to FIG. 8A, and the description is not repeated herein. In some embodiments, each dummy die 305 may comprise an insulating layer 903 on one side. In some embodiments, the insulating layers 903 may be formed using similar materials and methods as the insulating layer 417 described above with reference to FIG. 4B, and description is not repeated herein. In some embodiments, the insulating layers 903 and the insulating layer 609 may comprise a same material. In other embodiments, the insulating layers 903 and the insulating layer 609 may comprise different material. In some embodiments, the dummy dies 305 may be bonded to insulating layer 609 by bonding the insulating layers 903 of the dummy dies 305 to the insulating layer 609. In some embodiments, the insulating layers 903 may be bonded to the insulating layer 609 using a direct bonding method, such a fusion bonding method. In some embodiments, surface treatment processes may be performed on the insulating layers 903 and the insulating layer 609 prior to bonding the insulating layers 903 to the insulating layer 609. Subsequently, an annealing process may be performed to strengthen the bond between the insulating layers 903 and the insulating layer 609.

Figure 9C:
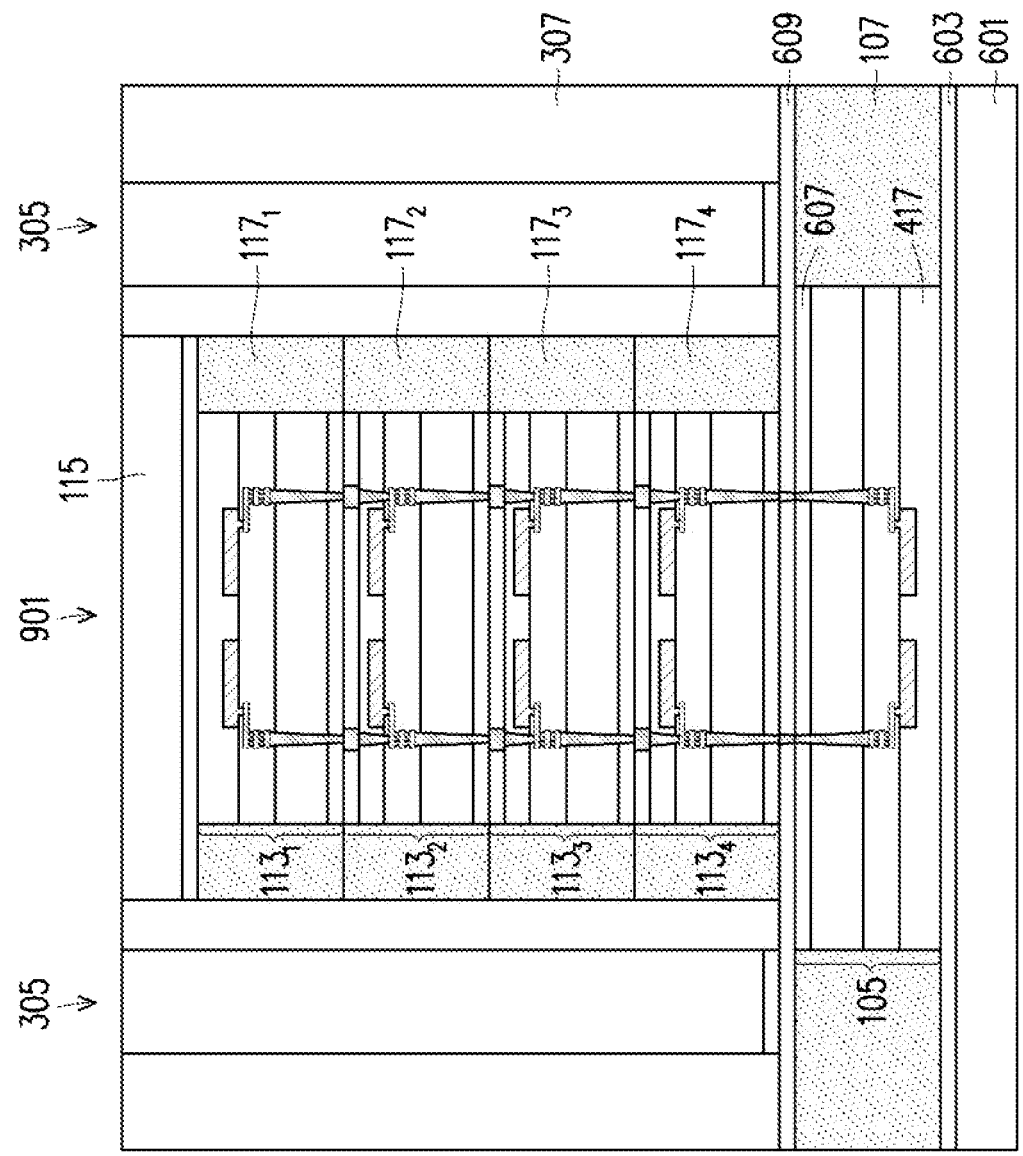

Referring to FIG. 9C, in some embodiments, the encapsulant 307 is formed over and surrounding the IC die structures 901 and the dummy dies 305. In some embodiments, the encapsulant 307 may be formed using similar materials methods as the encapsulant 107 described above with reference to FIG. 6B, and the description is not repeated herein. Subsequently, the encapsulant 307, the IC die structures 901 and the dummy dies 305 are planarized, such that topmost surfaces of the IC die structures 901 are substantially level or coplanar with topmost surfaces of the dummy dies 305 and a topmost surface of the encapsulant 307. In some embodiments, the planarization process may comprise a CMP process, a grinding process, an etching process, a combination thereof, or the like.

Referring to FIG. 9D, in some embodiments, the carrier 601 and the insulating layer 603 (see FIG. 9C) are removed to expose the insulating layers 417 of the IC dies 105, such that exposed surfaces of the insulating layers 417 are substantially level or coplanar with a topmost surface of the encapsulant 107. In some embodiments, the carrier 601 and the insulating layer 603 may be removed using a CMP process, a grinding process, an etching process, a combination thereof, or the like.

Referring to further to FIG. 9D, UBMs 707 are formed over and electrically coupled to the respective contact pads 415 of the IC dies 105, and connectors 111 are formed over and electrically coupled to the UBMs 707 as described above with reference to FIG. 7I, and the description is not repeated herein. After forming the connectors 111, the resulting structure is singulated into individual IC packages 300, such that each IC packages 300 comprises the IC die 105 with the respective stack of IC dies $113_1$-$113_4$ and the respective dummy dies 305. In some embodiments, the singulation process may comprise sawing, laser ablation, etching, a combination thereof, or the like. In other embodiments, the carrier 115 may be removed before performing the singulation process described with reference to FIG. 9D.

In such embodiments, the carrier 115 is omitted from the IC packages 300. In some embodiments, the carrier 115 may be removed using a CMP process, a grinding process, an etching process, a combination thereof, or the like. In yet other embodiments, the carrier 115 may be removed before performing the singulation process described above with reference to FIG. 9A.

Figure 10:
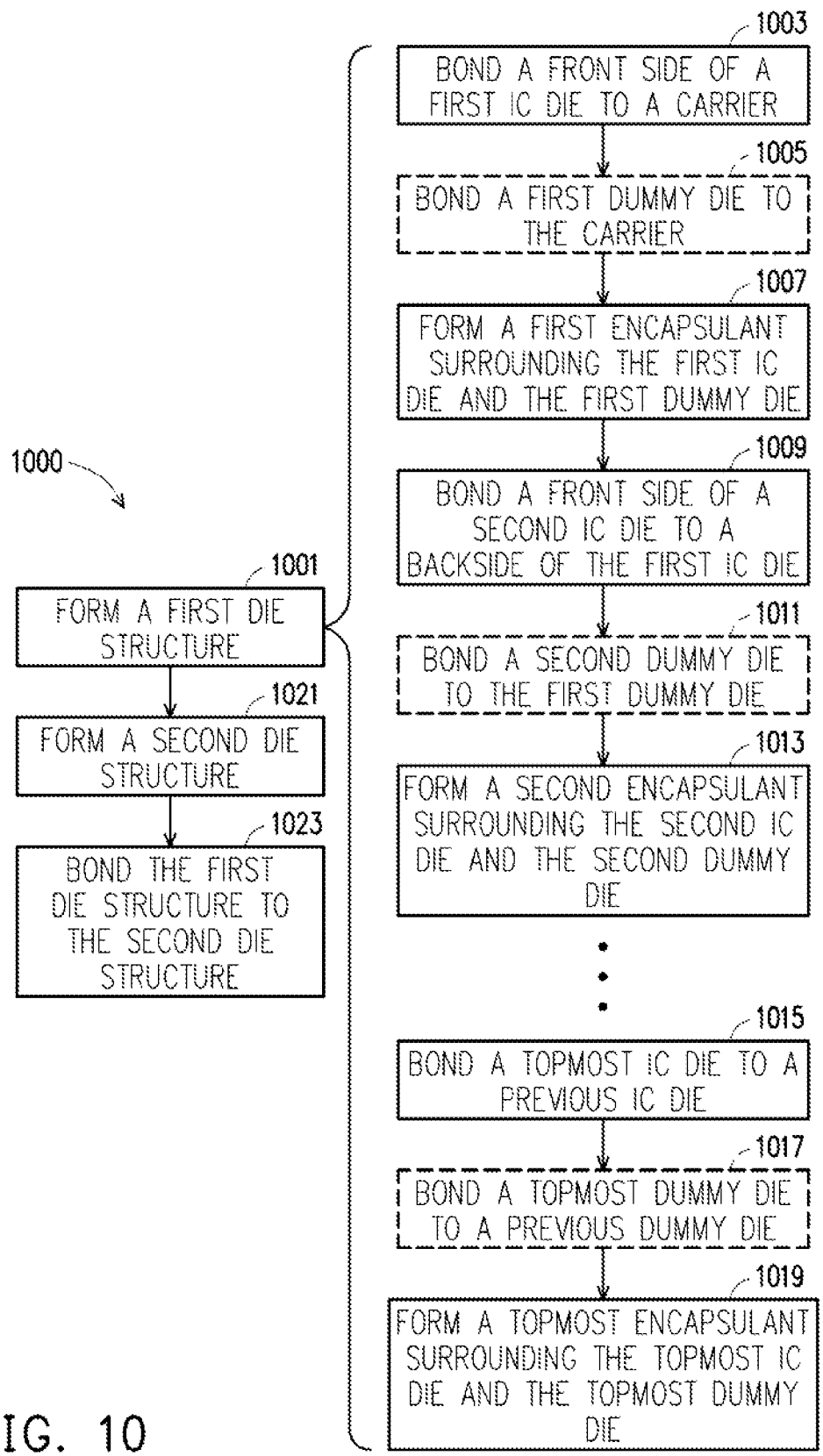
FIG. 10 is a flow diagram illustrating a method of forming of integrated circuit packages in accordance with some embodiments.

FIG. 10 is a flow diagram illustrating a method 1000 of forming of integrated circuit packages (such as, for example, IC packages 100A, 100B and 200 illustrated in FIGS. 1A, 1B and 2, respectively) in accordance with some embodiments. The method starts with step 1001, where a first die structure (such as, for example, the IC die structures 103 and 201 illustrated in FIGS. 1A, 1B and 2, respectively) is formed as described above with reference to FIG. 7A-7F or 8A-8C. In step 1021 a second die structure (such as, for example, the IC die structure 101 illustrated in FIGS. 1A, 1B and 2) is formed as described above with reference to FIGS. 6A-6H. In step 1023, the first die structure is bonded to the second due structure as described above with reference to FIG. 7G or 8C. A method of forming the first die structure starts with step 1003, where a first IC die (such as, for example, the IC die 113$_1$ illustrated in FIG. 7A or 8A) is bonded to a carrier (such as, for example, the carrier 115 illustrated in FIG. 7A or 8A) as described above with reference to FIG. 7A or 8A. In step 1005, a first dummy die (such as, for example, the dummy die 203$_1$ illustrated in FIG. 8A) is bonded to the carrier as described above with reference to FIG. 8A. In step 1007, a first encapsulant (such as, for example, the encapsulant 117$_1$ illustrated in FIG. 8B) is formed surrounding the first IC die and the first dummy die as described above with reference to FIG. 8B. In step 1009, a second IC die (such as, for example, the IC die 113$_2$ illustrated in FIG. 7E or 8C) is bonded to the first IC die as described above with reference to FIG. 7E or 8C. In step 1011, a second dummy die (such as, for example, the dummy die 203$_2$ illustrated in FIG. 8C) is bonded to the first dummy die as described above with reference to FIG. 8C. In step 1013, a second encapsulant (such as, for example, the encapsulant 117$_2$ illustrated in FIG. 8C) is formed surrounding the second IC die and the second dummy die as described above with reference to FIG. 8C. In some embodiments, the stacking process may continue until the desired number of IC dies and the desired number of dummy dies is bonded to the carrier. In step 1015, a topmost IC die (such as, for example, the IC die 113$_4$ illustrated in FIG. 7F or 8C) is bonded to a previous IC die (such as, for example, the IC die 113$_3$ illustrated in FIG. 7F or 8C) as described above with reference to FIG. 7F or 8C. In step 1017, a topmost dummy die (such as, for example, the dummy die 203$_4$ illustrated in FIG. 8C) is bonded to a previous dummy die (such as, for example, the dummy die 203$_3$ illustrated in FIG. 8C) as described above with reference to FIG. 8C. In step 1019, a topmost encapsulant (such as, for example, the encapsulant 117$_4$ illustrated in FIG. 8C) is formed surrounding the topmost die IC die and the topmost dummy die as described above with reference to FIG. 8C. In some embodiments, steps 1005, 1011 and 1017 may be omitted as described above with reference to FIGS. 7A-7F.

Figure 11:
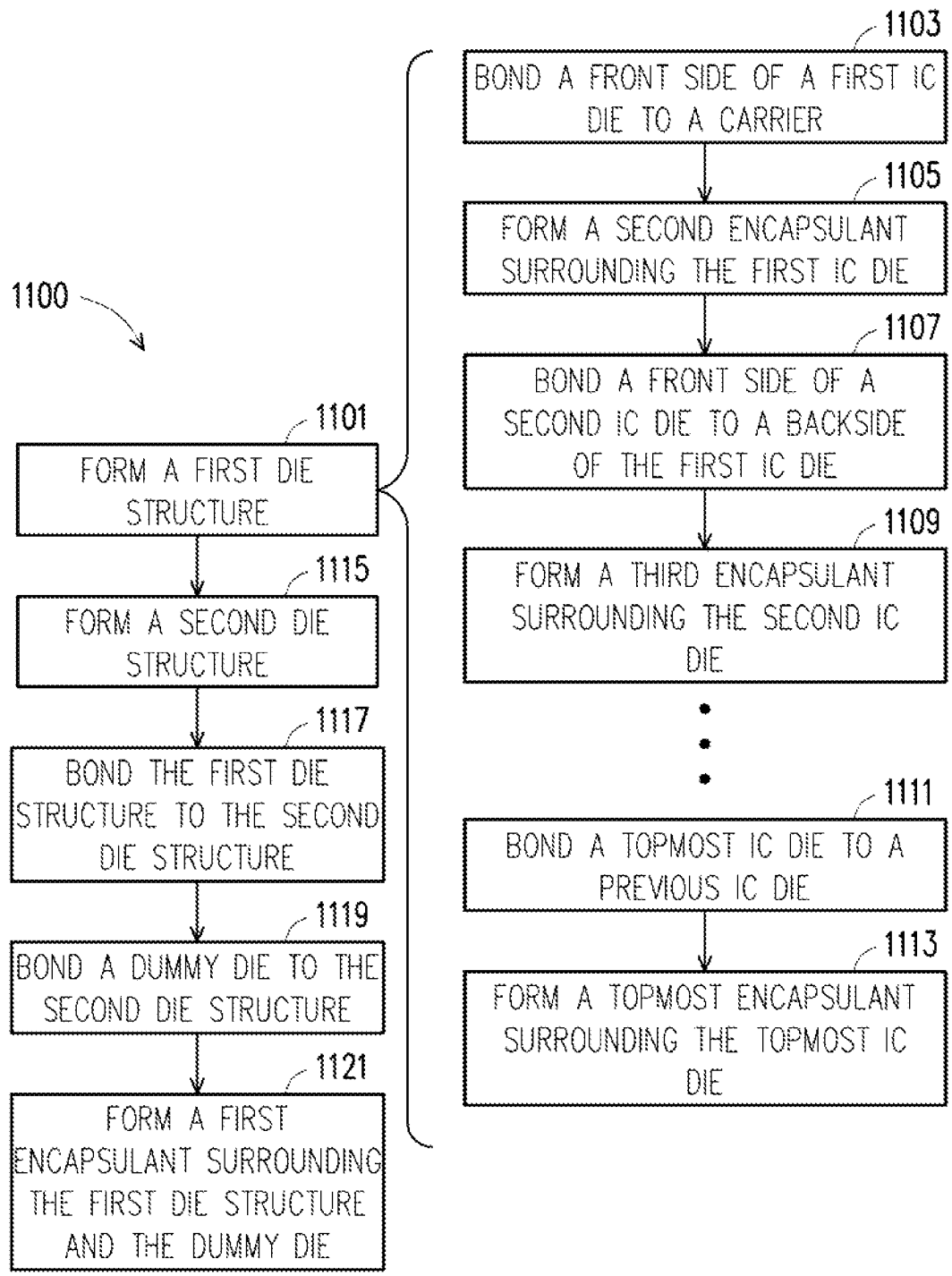
FIG. 11 is a flow diagram illustrating a method of forming of integrated circuit packages in accordance with some embodiments.

FIG. 11 is a flow diagram illustrating a method 1100 of forming of integrated circuit packages (such as, for example, the IC package 300 illustrated in FIG. 3) in accordance with some embodiments. The method starts with step 1101, where a first die structure (such as, for example, the IC die structure 901 illustrated in FIG. 9A) is formed as described above with reference to FIG. 9A. In step 1115, a second die structure (such as, for example, the IC die structure 301 illustrated in FIG. 3) is formed as described above with reference to FIGS. 6A-6H. In step 1117, the first die structure is bonded to the second due structure as described above with reference to FIG. 9B. In step 1119, a dummy die (such as, for example, the dummy die 305 illustrated in FIG. 9B) is bonded to the second die structure as described above with reference to FIG. 9B. In step 1121, a first encapsulant (such as, for example, the encapsulant 307 illustrated in FIG. 9C) is formed surrounding the first die structure and the dummy die as described above with reference to FIG. 9C. A method of forming the first die structure starts with step 1103, where a first IC die (such as, for example, the IC die 113$_1$ illustrated in FIG. 9A) is bonded to a carrier (such as, for example, the carrier 115 illustrated in FIG. 9A) as described above with reference to FIG. 9A. In step 1105, a second encapsulant (such as, for example, the encapsulant 117$_1$ illustrated in FIG. 9A) is formed surrounding the first IC die as described above with reference to FIG. 9A. In step 1107, a second IC die (such as, for example, the IC die 113$_2$ illustrated in FIG. 9A) is bonded to the first IC die as described above with reference to FIG. 9A. In step 1109, a third encapsulant (such as, for example, the encapsulant 117$_2$ illustrated in FIG. 9A) is formed surrounding the second IC die as described above with reference to FIG. 9A. In some embodiments, the stacking process may continue until the desired number of IC dies is bonded to the carrier. In step 1111, a topmost IC die (such as, for example, the IC die 113$_4$ illustrated in FIG. 9A) is bonded to a previous IC die (such as, for example, the IC die 113$_3$ illustrated in FIG. 9A) as described above with reference to FIG. 9A. In step 1113, a topmost encapsulant (such as, for example, the encapsulant 117$_4$ illustrated in FIG. 9A) is formed surrounding the topmost die IC die as described above with reference to FIG. 9A.

In accordance with an embodiment, a method includes: forming a first die structure, the first die structure including a die stack bonded to a carrier, where forming the first die structure includes: bonding a front side of a first integrated circuit die to the carrier; bonding a first dummy die to the carrier adjacent the first integrated circuit die; encapsulating the first integrated circuit die and the first dummy die in a first encapsulant; bonding a front side of a second integrated circuit die to a backside of the first integrated circuit die, the backside of the first integrated circuit die being opposite the front side of the first integrated circuit die; bonding a second dummy die to the first dummy die; and encapsulating the second integrated circuit die and the second dummy die in a second encapsulant; forming a second die structure, the second die structure including a third integrated circuit die; and bonding the first die structure to the second die structure by bonding a backside of a topmost integrated circuit die of the die stack to a backside of the third integrated circuit die, the topmost integrated circuit die of the die stack being a farthest integrated circuit die of the die stack from the carrier. In an embodiment, the front side of the first integrated circuit die is bonded to the carrier using a fusion bonding method. In an embodiment, the front side of the second integrated circuit die is bonded to the backside of the first integrated circuit die using a hybrid bonding method. In an embodiment, the backside of the topmost integrated circuit die of the die stack is bonded to the backside of the third integrated circuit die using a hybrid bonding method. In an embodiment, the first dummy die and the second dummy die form a heat dissipation structure. In an embodiment, the second dummy die is bonded to the first dummy die using a fusion bonding method. In an embodiment, bond pads at the backside of the topmost integrated circuit die of the die stack are in physical contact with bond pads at the backside of the third integrated circuit die.

In accordance with another embodiment, a method includes: forming a first die structure, the first die structure including a die stack bonded to a carrier, where forming the first die structure includes: bonding a front side of a first integrated circuit die to the carrier; encapsulating the first integrated circuit die in a first encapsulant; bonding a front side of a second integrated circuit die to a backside of the first integrated circuit die, the backside of the first integrated circuit die being opposite the front side of the first integrated circuit die; and encapsulating the second integrated circuit die in a second encapsulant; forming a second die structure, the second die structure including a third integrated circuit die; bonding the first die structure to the second die structure by bonding a backside of a topmost integrated circuit die of the die stack to a backside of the third integrated circuit die, the topmost integrated circuit die of the die stack being a farthest integrated circuit die of the die stack from the carrier; bonding a first dummy die to the second die structure adjacent the first die structure; and encapsulating the first die structure and the first dummy die in a third encapsulant. In an embodiment, the backside of the topmost integrated circuit die of the die stack is bonded to the backside of the third integrated circuit die using a hybrid bonding method. In an embodiment, the first dummy die is bonded to the second die structure using a fusion bonding method. In an embodiment, forming the second die structure includes encapsulating the third integrated circuit die in a fourth encapsulant. In an embodiment, the method further includes forming connectors on a front side of the third integrated circuit die, the front side of the third integrated circuit die being opposite the backside of the third integrated circuit die. In an embodiment, the first dummy die is configured as a heat dissipation structure. In an embodiment, the method further includes bonding a second dummy die to the second die structure, the first die structure being interposed between the first dummy die and the second dummy die.

In accordance with yet another embodiment, a semiconductor structure includes: a die stack bonded to a carrier, the die stack including a first integrated circuit die, the first integrated circuit die being a farthest integrated circuit die of the die stack from the carrier, a front side of the first integrated circuit die facing the carrier; a die structure bonded to the die stack, the die structure including a second integrated circuit die, a backside of the first integrated circuit die being in physical contact with a backside of the second integrated circuit die, the backside of the first integrated circuit die being opposite the front side of the first integrated circuit die; a heat dissipation structure bonded to the die structure adjacent the die stack; and an encapsulant extending along sidewalls of the die stack and sidewalls of the heat dissipation structure. In an embodiment, the heat dissipation structure includes one or more dummy dies. In an embodiment, the encapsulant extends along sidewalls of the carrier. In an embodiment, an exposed surface of the carrier is substantially level with an exposed surface of the heat dissipation structure. In an embodiment, the heat dissipation structure is in physical contact with the carrier. In an embodiment, an exposed surface of the carrier is substantially level with an exposed surface of the encapsulant.

In accordance with yet another embodiment, a method includes: forming a first encapsulated integrated circuit die over a carrier; forming a second encapsulated integrated circuit die over the first encapsulated integrated circuit die; bonding a third encapsulated integrated circuit die to the second encapsulated integrated circuit die; bonding a first dummy die to the third encapsulated integrated circuit die, the first dummy die and the second encapsulated integrated circuit die being on a same side of the third encapsulated integrated circuit die; and encapsulating the carrier, the first encapsulated integrated circuit die, the second encapsulated integrated circuit die, and the first dummy die in a first encapsulant.

In accordance with yet another embodiment, a semiconductor structure includes: a die structure, the die structure including a first integrated circuit die; a die stack bonded to the die structure, the die stack including a second integrated circuit die, a backside of the second integrated circuit die being in physical contact with a backside of the first integrated circuit die; a heat dissipation structure bonded to the die structure adjacent to the die stack, wherein a height of the heat dissipation structure is greater than or equal to a height of the die stack; and an encapsulant extending along sidewalls of the die stack and sidewalls of the heat dissipation structure.

In accordance with yet another embodiment, a semiconductor structure includes: a die structure, the die structure including a first integrated circuit die encapsulated in a first encapsulant; a second encapsulant over the die structure and the first encapsulant; a die stack embedded in the second encapsulant, the die stack including a second integrated circuit die, a backside of the second integrated circuit die being in physical contact with a backside of the first integrated circuit die; and a heat dissipation structure embedded in the second encapsulant, the heat dissipation structure being bonded to the die structure at an interface between the first integrated circuit die and the first encapsulant.

In accordance with yet another embodiment, a semiconductor structure includes: a die structure, the die structure including a first integrated circuit die; a die stack attached to the first integrated circuit die, the die stack including a second integrated circuit die, a backside of the second integrated circuit die being in physical contact with a backside of the first integrated circuit die; a base structure attached to the die stack, the die stack being interposed between the base structure and the first integrated circuit die, a width of the base structure being greater than a width of the die stack; a heat dissipation structure attached to the die structure adjacent to the die stack; and an encapsulant over the die structure, the die stack and the heat dissipation structure extending through the encapsulant.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a die structure, the die structure comprising a first integrated circuit die;
   a die stack bonded to the die structure, the die stack comprising a second integrated circuit die, a backside of the second integrated circuit die being bonded to a backside of the die structure;
   a base structure bonded to the die stack, the die stack being between the base structure and the die structure;
   a heat dissipation structure bonded to the die structure adjacent to the die stack, wherein a top surface of the heat dissipation structure is level with a top surface of the base structure; and
   a first encapsulant extending along sidewalls of the base structure, sidewalls of the die stack, and sidewalls of the heat dissipation structure.

2. The semiconductor structure of claim 1, wherein the die structure comprises a second encapsulant along sidewalls of the first integrated circuit die.

3. The semiconductor structure of claim 2, further comprising an insulating layer between the first encapsulant from the second encapsulant.

4. The semiconductor structure of claim 1, wherein the die stack comprises a third integrated circuit die bonded to the second integrated circuit die, wherein a second encapsulant extends along sidewalls of the second integrated circuit die, and wherein a third encapsulant extends along sidewalls of the third integrated circuit die.

5. The semiconductor structure of claim 4, wherein the second encapsulant is between the first encapsulant and the second integrated circuit die, and wherein the third encapsulant is between the first encapsulant and the third integrated circuit die.

6. The semiconductor structure of claim 1, wherein the heat dissipation structure comprises dummy dies, wherein the dummy dies comprise a semiconductor material.

7. The semiconductor structure of claim 1, wherein a width of the base structure is equal to a width of the die stack.

8. A semiconductor structure comprising:
   a die structure, the die structure comprising a first integrated circuit die encapsulated in a first encapsulant;
   a second encapsulant over the die structure and the first encapsulant;
   a die stack embedded in the second encapsulant, the die stack comprising a second integrated circuit die, wherein a backside of the second integrated circuit die is bonded to a backside of the first integrated circuit die;
   a base structure over the die stack and embedded in the second encapsulant, the die stack being interposed between the base structure and the first integrated circuit die; and
   a heat dissipation structure embedded in the second encapsulant, the heat dissipation structure being bonded to the die structure at an interface between the first integrated circuit die and the first encapsulant, wherein a top surface of the heat dissipation structure is level with a top surface of the base structure and a top surface of the second encapsulant.

9. The semiconductor structure of claim 8, further comprising an insulating layer separating the first encapsulant from the second encapsulant.

10. The semiconductor structure of claim 9, wherein the insulating layer extends between the first integrated circuit die and the second integrated circuit die.

11. The semiconductor structure of claim 8, wherein the die stack comprises a third integrated circuit die over the second integrated circuit die, wherein the die stack comprises a third encapsulant adjacent the second integrated circuit die and the second encapsulant, wherein the die stack comprises a fourth encapsulant adjacent the third integrated circuit die and the second encapsulant.

12. The semiconductor structure of claim 11, wherein the third integrated circuit die is an uppermost integrated circuit die in the die stack, wherein the base structure extends over the fourth encapsulant.

13. The semiconductor structure of claim 11, wherein the third encapsulant and the second encapsulant are laterally coterminous.

14. The semiconductor structure of claim 8, wherein a top surface of the base structure is substantially level with a top surface of the second encapsulant.

15. A semiconductor structure comprising:
   a die structure, the die structure comprising a first integrated circuit die encapsulated in a first encapsulant;
   a die stack attached to the first integrated circuit die, the die stack comprising a bottommost integrated circuit die, a backside of the bottommost integrated circuit die facing a backside of the first integrated circuit die;
   a second encapsulant over the first integrated circuit die and extending along sidewalls of the die stack, wherein a top surface of the second encapsulant is level with a top surface of the die stack;
   a base structure attached to the die stack and the second encapsulant, a width of the base structure being greater than a width of the die stack;
   a heat dissipation structure attached to the die structure adjacent to the die stack; and
   a third encapsulant over the die structure and extending along sidewalls of the base structure, sidewalls of the heat dissipation structure, and sidewalls of the second encapsulant, wherein a sidewall of the third encapsulant is coplanar with a sidewall of the first encapsulant.

16. The semiconductor structure of claim 15, wherein the die stack comprises a plurality of die stack layers, wherein each of the plurality of die stack layers comprising a second integrated circuit die and a third encapsulant extending along sidewalls of the respective second integrated circuit die.

17. The semiconductor structure of claim 15, wherein a width of the base structure is less than a width of the first integrated circuit die.

18. The semiconductor structure of claim 17, wherein the base structure and the die stack have a same width.

19. The semiconductor structure of claim 17, further comprising an insulating layer between the base structure and the die stack.

20. The semiconductor structure of claim 17, wherein an uppermost die of the die stack has an active side facing away from the die structure.

* * * * *